US012555968B2

United States Patent
Xie et al.

(10) Patent No.: US 12,555,968 B2
(45) Date of Patent: Feb. 17, 2026

(54) TERMINAL MEMBER, ASSEMBLY, SEMICONDUCTOR DEVICE, AND METHODS FOR MANUFACTURING SAME

(71) Applicant: Mitsubishi Electric Corporation, Tokyo (JP)

(72) Inventors: Chongfa Xie, Tokyo (JP); Ryuichi Ishii, Tokyo (JP); Takao Mitsui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 527 days.

(21) Appl. No.: 17/924,150

(22) PCT Filed: Jun. 25, 2021

(86) PCT No.: PCT/JP2021/024120
§ 371 (c)(1),
(2) Date: Nov. 9, 2022

(87) PCT Pub. No.: WO2022/004589
PCT Pub. Date: Jan. 6, 2022

(65) Prior Publication Data
US 2023/0187339 A1 Jun. 15, 2023

(30) Foreign Application Priority Data
Jun. 30, 2020 (JP) .................. 2020-112651

(51) Int. Cl.
*H01L 23/00* (2006.01)
*H01R 43/16* (2006.01)

(52) U.S. Cl.
CPC ............. *H01L 24/37* (2013.01); *H01R 43/16* (2013.01); *H01L 2224/37011* (2013.01); *H01L 2224/37013* (2013.01)

(58) Field of Classification Search
CPC .. H01L 2224/34–41505; H01L 23/495–49596
See application file for complete search history.

(56) References Cited

U.S. PATENT DOCUMENTS

| 5,508,561 A | 4/1996 | Tago et al. |
| 2002/0048853 A1* | 4/2002 | Mastboom .......... H01L 21/4842 257/E23.037 |

(Continued)

FOREIGN PATENT DOCUMENTS

| CN | 204144243 U | 2/2015 |
| JP | H05267516 A | 10/1993 |

(Continued)

OTHER PUBLICATIONS

A tapered hollow metallic microneedle array using backside exposure of SU-8, by Daniel S.-W. Park et al, in Journal of Micromechanics and Microengineering, Apr. 2004) (Year: 2004).*

(Continued)

*Primary Examiner* — Kevin Parendo
(74) *Attorney, Agent, or Firm* — Buchanan Ingersoll & Rooney PC

(57) ABSTRACT

Workability in a manufacturing process of a semiconductor device is improved. A terminal member is the terminal member joined to an electrode of a semiconductor element, and includes a conductor portion, a first annular projecting portion, and an annular recess. The conductor portion has a first main surface and a second main surface located on a side opposite to the first main surface. The first annular projecting portion is provided on the first main surface of the conductor portion. The annular recess is provided on the second main surface and is disposed at a position overlapping with the first annular projecting portion. By pressing a (Continued)

joining member against the first main surface of the terminal member, the first annular projecting portion can be embedded in the joining member.

20 Claims, 12 Drawing Sheets

(56) References Cited

U.S. PATENT DOCUMENTS

| | | | | |
|---|---|---|---|---|
| 2006/0220196 | A1* | 10/2006 | Oshima | H01L 23/49551 |
| | | | | 257/E23.047 |
| 2011/0227205 | A1* | 9/2011 | Lu | H01L 24/84 |
| | | | | 438/109 |
| 2013/0009295 | A1* | 1/2013 | Otremba | H01L 24/83 |
| | | | | 257/676 |
| 2013/0134210 | A1 | 5/2013 | Muto et al. | |
| 2014/0084438 | A1* | 3/2014 | Soyano | H01L 24/81 |
| | | | | 257/676 |
| 2016/0141214 | A1* | 5/2016 | Sato | H01L 23/49811 |
| | | | | 257/77 |
| 2019/0057921 | A1 | 2/2019 | Ooshima et al. | |
| 2019/0074236 | A1 | 3/2019 | Fuku et al. | |
| 2019/0189537 | A1* | 6/2019 | Fujino | H01L 23/48 |
| 2020/0075529 | A1 | 3/2020 | Otsuka et al. | |

FOREIGN PATENT DOCUMENTS

| | | |
|---|---|---|
| JP | H07142488 A | 6/1995 |
| JP | 2004303869 A | 10/2004 |
| JP | 2013131735 A | 7/2013 |
| JP | 2017191857 A | 10/2017 |
| WO | 2013021726 A1 | 2/2013 |
| WO | 2017203650 A1 | 11/2017 |
| WO | 2018207856 A1 | 11/2018 |
| WO | 2019167102 A1 | 9/2019 |

OTHER PUBLICATIONS

International Search Report (PCT/ISA/210) with translation and Written Opinion (PCT/ISA/237) mailed on Sep. 14, 2021, by the Japan Patent Office as the International Searching Authority for International Application No. PCT/JP2021/024120. (12 pages).

* cited by examiner

TERMINAL MEMBER, ASSEMBLY, SEMICONDUCTOR DEVICE, AND METHODS FOR MANUFACTURING SAME

TECHNICAL FIELD

The present disclosure relates to a terminal member, an assembly, a semiconductor device, and methods for manufacturing the same.

BACKGROUND ART

Conventionally, as a structure of joining an electrode of a semiconductor element to a wiring substrate or a terminal member such as a lead frame, various proposals have been made such as a structure using solder bumps (see Japanese Patent Laying-Open No. No. 7-142488, for example). Japanese Patent Laying-Open No. 7-142488 discloses a semiconductor device including a solder bump that is connected to each of a plurality of electrodes of a semiconductor element and that includes a metal protrusion having a columnar protrusion and a hemispherical solder that covers the protrusion.

CITATION LIST

Patent Literature

PTL 1: Japanese Patent Laying-Open No. 7-142488

SUMMARY OF INVENTION

Technical Problem

In the conventional semiconductor device described above, in order to provide a solder bump, it is necessary to perform a step of connecting a metal protrusion to an electrode and a step of temporarily placing a solder piece on the metal protrusion and heating and melting the solder piece to provide hemispherical solder, and thus there is room for improvement in workability in the manufacturing process of the semiconductor device.

Therefore, an object of the present disclosure is to improve workability in a manufacturing process of a semiconductor device.

Solution to Problem

A terminal member according to the present disclosure is a terminal member to be joined to an electrode of a semiconductor element, and includes a conductor portion, a first annular projecting portion, and an annular recess. The conductor portion has a first main surface and a second main surface. The second main surface is located on a side opposite to the first main surface. The first annular projecting portion is provided on the first main surface of the conductor portion. The first annular projecting portion has an annular shape in planar view. The annular recess is provided on the second main surface. The annular recess is disposed at a position overlapping with the first annular projecting portion.

An assembly according to the present disclosure includes the terminal member and a joining member. The joining member is connected to the first main surface of the terminal member. The first annular projecting portion of the terminal member bites into the joining member.

A semiconductor device according to the present disclosure includes the assembly and a semiconductor element including an electrode. The joining member of the assembly is connected to the electrode.

A method for manufacturing a terminal member according to the present includes a step of preparing a conductor portion. The conductor portion has a first main surface and a second main surface located on a side opposite to the first main surface. The method for manufacturing the terminal member includes steps of providing a first protrusion and providing a first annular projecting portion. In the step of providing the first protrusion, the first protrusion is provided on the first main surface by press working to the conductor portion. In the step of providing the first annular projecting portion, the first annular projecting portion having an annular shape in planar view is provided by pressing a part of the first protrusion toward the second main surface. In the step of providing the first annular projecting portion, the annular recess is provided at a position on the second main surface overlapping with the first annular projecting portion.

A method for manufacturing a terminal member according to the present includes a step of preparing a conductor portion. The conductor portion has a first main surface and a second main surface located on a side opposite to the first main surface. The method for manufacturing the terminal member includes steps of providing a first protrusion and providing a first annular projecting portion. In the step of providing the first protrusion, the first protrusion is provided on the first main surface by press working to the conductor portion. In the step of providing the first annular projecting portion, the first annular projecting portion having an annular shape in planar view is provided, either by pressing a part of the first protrusion toward the second main surface, or by providing a first through hole penetrating the conductor portion at the first protrusion.

A method for manufacturing an assembly according to the present disclosure includes a step of arranging a joining member on a surface of a support base, a step of arranging a terminal member, and a step of pressing the terminal member. In the step of arranging the terminal member, the terminal member is arranged on the joining member. In the step of arranging the terminal member, the terminal member is arranged such that the first main surface of the terminal member faces the joining member. A protrusion is provided on the surface of the support base. A protrusion is provided at a position overlapping with the first annular projecting portion of the terminal member in a state where the terminal member is disposed on the joining member in the step of arranging the terminal member. In the step of pressing, the terminal member is pressed relatively against the joining member. In the step of pressing, the first annular projecting portion of the terminal member bites into the joining member.

A method for manufacturing an assembly according to the present disclosure includes a step of arranging a joining member on a surface of a support base, a step of arranging a terminal member, and a step of pressing. In the step of arranging the terminal member, the terminal member is arranged on the joining member. In the step of arranging the terminal member, the terminal member is arranged such that the first main surface of the terminal member faces the joining member. A through hole is provided on the surface of the support base at a position overlapping with the first annular projecting portion of the terminal member in a state where the terminal member is disposed on the joining member in the step of arranging the terminal member. The support base includes a rod-shaped member movably inserted into the through hole. In the step of pressing, the joining member is pressed toward a side of the terminal member by the rod-shaped member, and the terminal member is relatively pressed against the joining member. In the step of pressing, the first annular projecting portion of the terminal member bites into the joining member.

A method for manufacturing an assembly according to the present disclosure includes a step of arranging a joining member on a surface of a support base, a step of arranging a terminal member, and a step of pressing. In the step of arranging the terminal member, the terminal member is arranged on the joining member. In the step of arranging the terminal member, the terminal member is arranged such that the first main surface of the terminal member faces the joining member. In the step of pressing, the terminal member is pressed relatively against the joining member. In the step of pressing, the first annular projecting portion of the terminal member bites into the joining member. The method for manufacturing the assembly further includes a step of pressing the second annular projecting portion. In the step of pressing the second annular projecting portion, after the step of pressing, the second annular projecting portion of the terminal member is pressed toward the joining member.

A method for manufacturing a semiconductor device according to the present disclosure includes: a step of preparing, a step of arranging, and a step of connecting a semiconductor element having an electrode. In the step of arranging, the assembly is arranged on the electrode. In the step of arranging, the assembly is arranged such that the joining member of the assembly is in contact with the electrode. In the step of connecting, the terminal member and the electrode of the semiconductor element are connected by heating the assembly and melting the joining member.

Advantageous Effects of Invention

According to the above, it is possible to improve workability in a manufacturing process of a semiconductor device.

DESCRIPTION OF EMBODIMENTS

Figure 1:
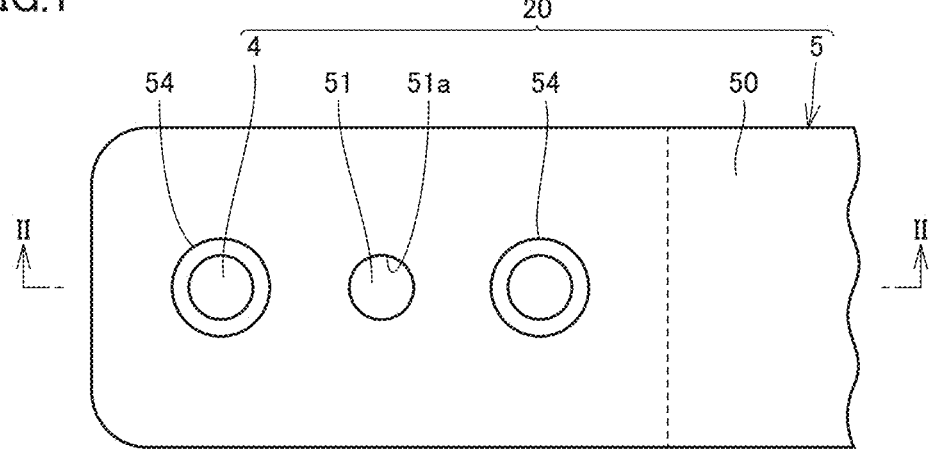
FIG. 1 is a schematic plan view of an assembly according to a first embodiment.

Hereinafter, embodiments of the present disclosure will be described. The same components are denoted by the same reference numerals, and the description thereof will not be repeated.

First Embodiment

Configurations of Terminal Member and Assembly

Figure 2:
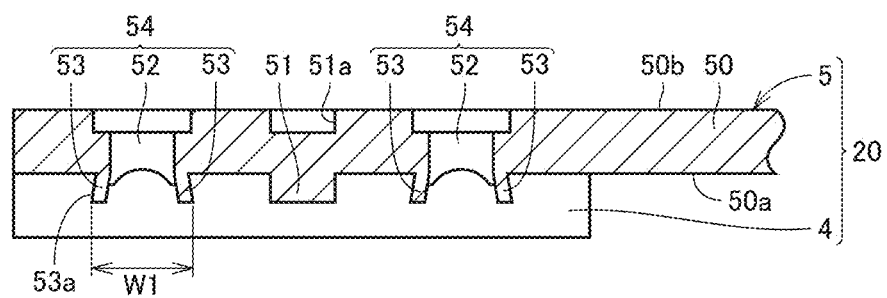
FIG. 2 is a schematic cross-sectional view taken along line II-II in FIG. 1.
Figure 3:
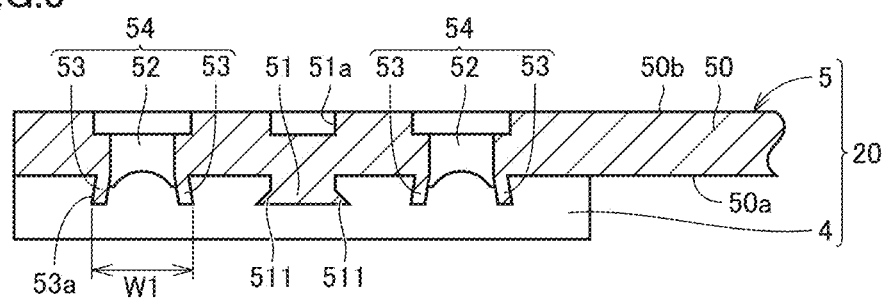
FIG. 3 is a schematic cross-sectional view for illustrating a modification of a configuration of a projecting portion of the assembly illustrated in FIG. 2.
Figure 4:
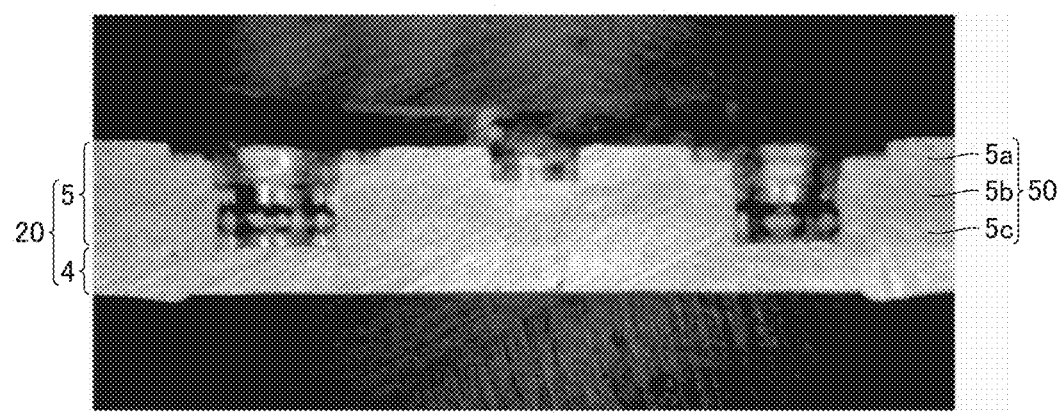
FIG. 4 is a cross-sectional photograph of an example of the assembly shown in FIG. 2.
Figure 5:
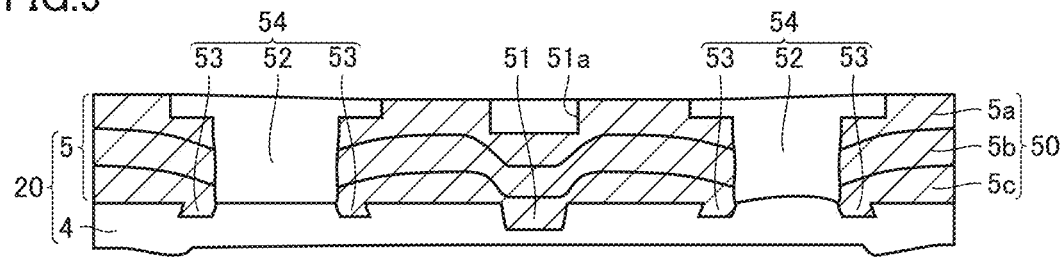
FIG. 5 is a schematic view for illustrating the cross-sectional photograph shown in FIG. 4.

FIG. 1 is a schematic plan view of an assembly according to a first embodiment. FIG. 2 is a schematic cross-sectional view taken along line II-II in FIG. 1. FIG. 3 is a schematic cross-sectional view for illustrating a modification of a configuration of a projecting portion of the assembly illustrated in FIG. 2. FIG. 3 corresponds to FIG. 2. FIG. 4 is a cross-sectional photograph of an example of the assembly shown in FIG. 2. FIG. 5 is a schematic view for illustrating the cross-sectional photograph shown in FIG. 4.

An assembly 20 shown in FIGS. 1 and 2 includes a terminal member 5 and a joining member 4. Joining member 4 is connected to terminal member 5.

Terminal member 5 is, for example, a lead, and is joined to an electrode of a semiconductor element via joining member 4. Terminal member 5 mainly includes a conductor portion 50, a first annular projecting portion 53, and a projecting portion 51 as a columnar projecting portion. Conductor portion 50 has a plate-like shape and includes a first main surface 50a and a second main surface 50b. Second main surface 50b is located on a side opposite to first main surface 50a. A first through hole 52 is provided on an inner peripheral side of first annular projecting portion 53. The first through hole may not be provided on the inner peripheral side of first annular projecting portion 53.

In conductor portion 50 of terminal member 5, two first annular projecting portions 53 and one projecting portion 51 are provided on first main surface 50a. Projecting portion 51 is arranged on the same straight line as two first annular projecting portions 53. Projecting portion 51 is arranged at the center of a region between two first annular projecting portions 53. Two first annular projecting portions 53 and projecting portion 51 are arranged at intervals from each other. First annular projecting portions 53 have an annular shape in planar view. Projecting portion 51 has a circular shape or a polygonal shape in planar view. The number of first annular projecting portions 53 may be 2 as illustrated, but may be 1 or 3 or more. When the number of first annular projecting portions 53 is 3 or more, it is desirable that distances between projecting portion 51 and the plurality of first annular projecting portions 53 substantially coincide with each other. The number of projecting portion 51 may be 1 as illustrated, but may be 2 or more according to the number of first annular projecting portions 53. By arranging first annular projecting portion 53 and projecting portion 51 adjacent to each other, at the time of temporary attachment to joining member 4 as described later, joining member 4 is sandwiched between first annular projecting portion 53 and projecting portion 51, and the effect of temporary attachment can be enhanced.

First annular projecting portion 53 has an outer peripheral side surface 53a. Outer peripheral side surface 53a is inclined with respect to first main surface 50a such that an outer peripheral width W1 of first annular projecting portion 53 increases as the distance from first main surface 50a increases. Outer peripheral side surface 53a may extend in a direction substantially perpendicular to first main surface 50a. Alternatively, the inclination direction of outer peripheral side surface 53a may be opposite to the example shown in FIG. 2. The width of projecting portion 51 is substantially constant regardless of the position in the direction perpendicular to first main surface 50a. The width of projecting portion 51 may increase as the distance from first main surface 50a increases. For example, as illustrated in FIG. 3, projecting portion 51 may include a widened portion 511 such that the width of projecting portion 51 increases toward a tip of projecting portion 51. In this way, it is possible to increase a caulking effect between terminal member 5 and joining member 4 at the time of temporary attachment between terminal member 5 and joining member 4 described later. Therefore, it is possible to improve joint strength at the time of temporary joining of terminal member 5 and joining member 4. As for the shape of widened portion 511, as long as the width of projecting portion 51 can be made wider than the width of projecting portion 51 on a side of first main surface 50a, any shape other than the triangular cross section as shown in FIG. 3 can be adopted. For example, the cross-sectional shape of widened portion 511 in the cross section along the extending direction of projecting portion 51 illustrated in FIG. 3 may be a semicircular shape or a polygonal shape such as a quadrangular shape.

First annular projecting portion 53 has an annular shape whose outer periphery is substantially circular in planar view, but the shape of the outer periphery in planar view may be an elliptical shape or a polygonal shape such as a triangular shape or a quadrangular shape. The shape of projecting portion 51 in planar view may be any shape other than the circular shape. For example, the shape of projecting portion 51 in planar view may be an elliptical shape or a polygonal shape such as a triangular shape, a quadrangular shape, or a pentagonal shape.

Conductor portion 50 is provided with first through hole 52 on the inner peripheral side of first annular projecting portion 53. First through hole 52 extends from first main surface 50a to second main surface 50b of conductor portion 50. As described above, first through hole 52 may not be provided on the inner peripheral side of first annular projecting portion 53. For example, a bottomed recess may be provided on the inner peripheral side of first annular projecting portion 53. The width of the bottomed recess may be substantially the same over the length of the bottomed recess from a side of first main surface 50a toward a side of second main surface 50b. Further, the width may be gradually narrowed from the side of first main surface 50a toward the side of second main surface 50b. Alternatively, the width may be locally different. As illustrated in FIG. 2, in first through hole 52, the width of the region located on the side of second main surface 50b is larger than the width of the region located on the side of first main surface 50a. From a different point of view, the region of first through hole 52 located on a side of second main surface 50b is provided so as to overlap first annular projecting portion 53 in planar view in a direction perpendicular to first main surface 50a.

In conductor portion 50, a recess 51a is provided in a region on second main surface 50b overlapping with projecting portion 51. As illustrated in FIG. 2, the depth of recess 51a is substantially the same as the depth of a region located on the side of second main surface 50b in first through hole 52 (a relatively wide region).

Joining member 4 is, for example, a solder block, and is connected to first main surface 50a of terminal member 5. First annular projecting portion 53 of terminal member 5 bites into joining member 4. That is, a part of joining member 4 is caulked by a caulking portion 54 including first annular projecting portion 53 and first through hole 52 of terminal member 5. Projecting portion 51 of terminal member 5 bites into joining member 4. In this manner, joining member 4 is temporarily attached to terminal member 5.

Conductor portion 50 of terminal member 5 has a multilayer structure including a plurality of layers 5a, 5b, and 5c laminated in a direction intersecting first main surface 50a. The plurality of layers 5a, 5b, and 5c may be made of an arbitrary conductor. For example, layers 5a and 5c include copper (Cu), and layer 5b includes invar. Invar is an alloy containing iron and nickel, and is, for example, an alloy obtained by adding 36% of nickel to iron. The number of layers constituting conductor portion 50 may be 4 or more, or 1 or 2.

The thickness of terminal member 5 may be greater than or equal to 0.5 mm and less than or equal to 2 mm, greater than or equal to 0.7 mm and less than or equal to 1.5 mm, greater than or equal to 0.9 mm and less than or equal to 1.2 mm, or 1 mm, for example.

The shape of joining member 4 in planar view can be any shape, but may be, for example, a quadrangular shape. The shape of joining member 4 in planar view may be, for example, a quadrangular shape having a length of 10 mm and a width of 5 mm. The thickness of joining member 4 may be greater than or equal to 0.3 mm and less than or equal to 1 mm, greater than or equal to 0.4 mm and less than or equal to 0.8 mm, or 0.4 mm, for example. For example, lead-free solder can be used as a material of joining member 4. As a material of joining member 4, an M20 solder (Sn-0.75Cu (wt %)) or an M754 solder (0.75Sn-0.25Cu (wt %)) can be used.

Outer peripheral width W1 of first annular projecting portion 53 may be greater than or equal to 1 mm and less than or equal to 2 mm, or may be greater than or equal to 1.5 mm and less than or equal to 1.8 mm, for example. The diameter of first through hole 52 may be greater than or equal to 1 mm and less than or equal to 2 mm, greater than or equal to 1 mm and less than or equal to 1.5 mm, or greater than or equal to 1.2 mm and less than or equal to 1.4 mm. The width of projecting portion 51 may be greater than or equal to 0.3 mm and less than or equal to 1.5 mm, greater than or equal to 0.5 mm and less than or equal to 1 mm, or greater than or equal to 0.6 mm and less than or equal to 0.8 mm.

The height of projecting portion 51 is preferably smaller than the thickness of joining member 4. For example, when the thickness of joining member 4 is 0.4 mm, the height of projecting portion 51 may be greater than or equal to 0.3 mm and less than or equal to 0.35 mm. The height of first annular projecting portion 53 may be smaller than the height of projecting portion 51. For example, the height of first annular projecting portion 53 may be less than or equal to 50% of the height of projecting portion 51. The height of first annular projecting portion 53 may be greater than or equal to 0.1 mm and less than or equal to 0.35 mm, greater than or equal to 0.2 mm and less than or equal to 0.30 mm, or greater than or equal to 0.30 mm and less than or equal to 0.35 mm, for example.

Method for Manufacturing Terminal Member

FIGS. 6 to 9 are schematic views for illustrating a method for manufacturing the terminal member constituting the assembly illustrated in FIG. 1. A method for manufacturing terminal member 5 will be described with reference to FIGS. 6 to 9. In FIGS. 6 to 9, only a step of providing one first annular projecting portion 53 is illustrated in order to simplify the description. In the method for manufacturing terminal member 5 described below, press working is used as a method for providing first annular projecting portion 53. By using press working, a sharp edge portion can be provided at a tip of first annular projecting portion 53. By providing such an edge portion, it is possible to obtain an effect that first annular projecting portion 53 easily bites into joining member 4 in the step of temporarily attaching terminal member 5 and joining member 4. First annular projecting portion 53 may be provided not only by press working but also by any method capable of providing an edge portion for first annular projecting portion 53.

Figure 6:
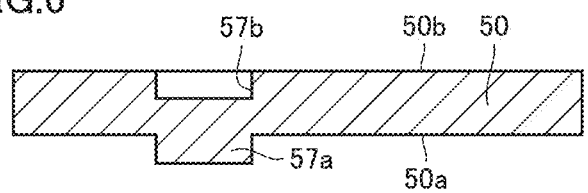
FIG. 6 is a schematic view for illustrating a method for manufacturing a terminal member constituting the assembly shown in FIG. 1.

First, a step of preparing conductor portion 50 to be a terminal member is performed. Conductor portion 50 has first main surface 50a and second main surface 50b located on the side opposite to first main surface 50a. As illustrated in FIG. 6, a process of providing a first protrusion 57a as a first columnar protrusion on the conductor portion 50 is performed. In the step of providing first protrusion 57a, first protrusion 57a is provided on first main surface 50a by press working to second main surface 50b of conductor portion 50. At this time, as illustrated in FIG. 6, a first recess 57b is provided in second main surface 50b. By providing first recess 57b, a region overlapping with first recess 57b on first main surface 50a is plastically deformed so as to protrude, and first protrusion 57a is provided. Note that the shape of first protrusion 57a in planar view is circular, but may be any other shape. For example, the shape of first protrusion 57a in planar view may be an elliptical shape or a polygonal shape such as a triangular shape, a quadrangular shape, or a pentagonal shape.

Figure 7:
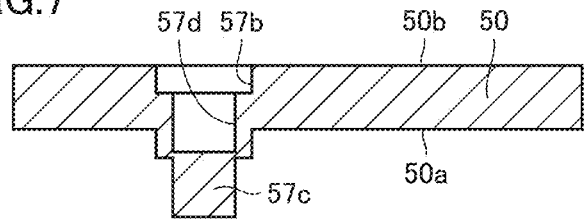
FIG. 7 is a schematic view for illustrating the method for manufacturing the terminal member constituting the assembly shown in FIG. 1.
Figure 8:
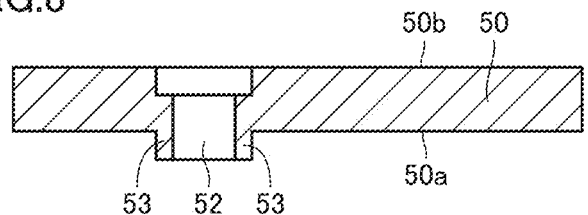
FIG. 8 is a schematic view for illustrating the method for manufacturing the terminal member constituting the assembly shown in FIG. 1.

Next, a step of providing first annular projecting portion 53 is performed as illustrated in FIGS. 7 and 8. Specifically, as illustrated in FIG. 7, a step of providing a protruding portion 57c is first performed. In the step of providing protruding portion 57c, press working to first recess 57b is performed. As a result, a second recess 57d that extends from the inside of first recess 57b toward the inside of first protrusion 57a and is to be first through hole 52 (see FIG. 8) is provided. By providing second recess 57d in this manner, protruding portion 57c protruding from first protrusion 57a in the extending direction of second recess 57d is provided as a result.

Next, as illustrated in FIG. 8, a step of providing first through hole 52 is performed. In the step of providing first through hole 52, protruding portion 57c is removed from first protrusion 57a. As a result, first through hole 52 is provided by providing an opening continuous with second recess 57d in a surface of first protrusion 57a. First annular projecting portion 53, which is a remaining portion of first protrusion 57a (see FIG. 6), is provided so as to surround first through hole 52. That is, as illustrated in FIGS. 7 and 8, in first protrusion 57a, by providing first through hole 52 that penetrates conductor portion 50, first annular projecting portion 53 having an annular shape in planar view is provided. By providing first through hole 52 inside first protrusion 57a, first annular projecting portion 53 can be easily provided on first main surface 50a without positional displacement.

Figure 9:
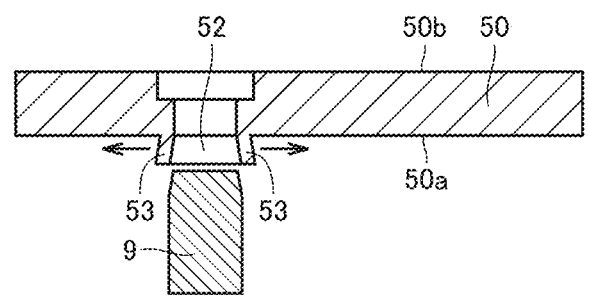
FIG. 9 is a schematic view for illustrating the method for manufacturing the terminal member constituting the assembly shown in FIG. 1.

Next, as illustrated in FIG. 9, a step of radially deforming first annular projecting portion 53 is performed. Specifically, by inserting a rod-shaped die 9 into first annular projecting portion 53 from a side of first main surface 50a, first annular projecting portion 53 is deformed so as to spread radially outward as indicated by an arrow in FIG. 9. A tip portion of rod-shaped die 9 has a frustum shape. The width of a region other than the tip portion of rod-shaped die 9 is larger than the diameter of first through hole 52 illustrated in FIG. 8. In this manner, terminal member 5 constituting assembly 20 illustrated in FIG. 1 is obtained.

Note that the order of the above-described steps may be appropriately changed. For example, after the step of providing first through hole 52 as shown in FIGS. 7 and 8 is performed first, first annular projecting portion 53 may be provided on first main surface 50a by providing first recess 57b shown in FIG. 6. The steps illustrated in FIG. 9 may be omitted. In addition, the step of obtaining terminal member 5 from the plate-shaped member by press working may be performed simultaneously with one of the steps of providing first annular projecting portion 53 and first through hole 52 described above. Further, the step of providing projecting portion 51 may be performed simultaneously with one of the steps of providing first annular projecting portion 53 and first through hole 52 described above. For example, projecting portion 51 may be provided simultaneously with the process illustrated in FIG. 6.

Method for Manufacturing Assembly

Figure 10:
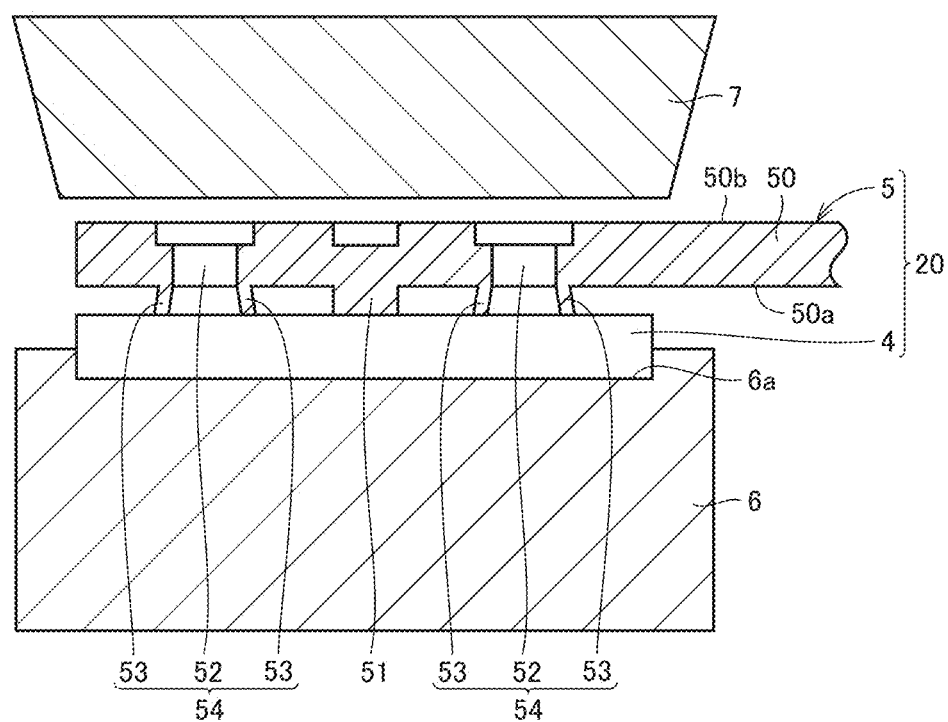
FIG. 10 is a schematic view for illustrating a method for manufacturing the assembly shown in FIG. 1.

FIG. 10 is a schematic view for illustrating a method for manufacturing the assembly shown in FIG. 1. The method for manufacturing assembly 20 will be described with reference to FIG. 10.

In the method for manufacturing assembly 20, a support base 6 and a pressing member 7 are used as illustrated in FIG. 10. Specifically, first, a step of arranging joining member 4 on a surface 6a of support base 6 is performed. Surface 6a of support base 6 on which joining member 4 is disposed is, for example, a recess provided on the surface of support base 6. Joining member 4 is mounted on surface 6a. Joining member 4 is, for example, a solder block obtained by cutting tape-shaped solder.

Next, a step of arranging terminal member 5 is performed. In this step, terminal member 5 is disposed on joining member 4. In this step, terminal member 5 is disposed such that first main surface 50a of terminal member 5 faces joining member 4, and first annular projecting portion 53 and projecting portion 51 overlap joining member 4. At this time, terminal member 5 is preferably supported by a support member that is not illustrated. As the support member, for example, a robot arm may be used, or a jig having a support portion that supports terminal member 5 may be used.

Next, a step of pressing is performed. In this step, pressing member 7 presses terminal member 5 toward joining member 4, thereby relatively pressing terminal member 5 against joining member 4. As a result, first annular projecting portion 53 and projecting portion 51 are pressed against joining member 4, and first annular projecting portion 53 and projecting portion 51 bite into joining member 4. In this way, as shown in FIG. 2, assembly 20 in which joining member 4 is temporarily fixed (temporarily fixed) to terminal member 5 is obtained.

Operation and Effects

Terminal member 5 according to the present disclosure is terminal member 5 joined to an electrode of a semiconductor element, and includes conductor portion 50 and first annular projecting portion 53. Conductor portion 50 has first main surface 50a. First annular projecting portion 53 is provided on first main surface 50a of conductor portion 50. First annular projecting portions 53 have an annular shape in planar view.

In this way, for example, by pressing joining member 4 such as a solder block against first main surface 50a of terminal member 5, a state in which first annular projecting portion 53 is embedded in joining member 4 (a state in which joining member 4 is caulked by first annular projecting portion 53) can be obtained. Therefore, assembly 20 in which joining member 4 is fixed to terminal member 5 can be easily provided. By using such an assembly 20, when terminal member 5 is joined to the electrode of the semiconductor element, positioning of joining member 4 and terminal member 5 with respect to the electrode can be easily performed by arranging assembly 20 on the electrode. Further, since joining member 4 and terminal member 5 are firmly joined as first annular projecting portion 53 is embedded in joining member 4, terminal member 5 and joining member 4 can be integrally conveyed as assembly 20. In addition, it is possible to suppress occurrence of problems that joining member 4 falls off from terminal member 5 at the time of conveyance and that arrangement of joining member 4 with respect to terminal member 5 is displaced. As a result, it is possible to improve workability in the manufacturing process of the semiconductor device using terminal member 5.

In addition, by disposing assembly 20 on the electrode as described above, heating and re-solidifying joining member 4 after melting, the electrode and terminal member 5 can be joined by joining member 4. At this time, since first annular projecting portion 53 is provided on terminal member 5, a joining area between terminal member 5 and joining member 4 can be made larger than that in a case where first annular projecting portion 53 is not provided. As a result, it is possible to improve joint strength between joining member 4 and terminal member 5.

In addition, as described above, since first annular projecting portion 53 exists when joining member 4 is melted and re-solidified, the distance between terminal member 5 and the electrode (that is, the thickness of joining member 4) can be maintained at a certain size.

In terminal member 5, first annular projecting portion 53 may have outer peripheral side surface 53a. Outer peripheral side surface 53a may be inclined with respect to first main surface 50a such that outer peripheral width W1 of first annular projecting portion 53 increases as the distance from first main surface 50a increases.

In this case, when joining member 4 is pressed against first main surface 50a of terminal member 5, it is possible to cause first annular projecting portion 53 to bite into joining member 4 more firmly. As a result, it is possible to join joining member 4 to terminal member 5 more firmly.

Terminal member 5 may include projecting portion 51. Projecting portion 51 as the columnar projecting portion may have a circular shape or a polygonal shape in planar view. Projecting portion 51 may be provided at a position away from first annular projecting portion 53 on first main surface 50a. The width of projecting portion 51 may be constant regardless of the position in the direction perpendicular to first main surface 50a. Alternatively, the width may increase as the distance from first main surface 50a increases.

In this case, projecting portion 51 bites into joining member 4 similarly to first annular projecting portion 53, so that joining member 4 can be more firmly joined to terminal member 5. As a result, it is possible to improve workability in the manufacturing process of the semiconductor device using terminal member 5.

In addition, since projecting portion 51 is provided, the joining area between terminal member 5 and joining member 4 can be made larger than that in a case where projecting portion 51 is not provided. Further, similarly to first annular projecting portion 53, when joining member 4 is melted and re-solidified, the distance between terminal member 5 and the electrode (that is, the thickness of joining member 4) can be maintained at a certain size.

In terminal member 5, conductor portion 50 may be provided with first through hole 52 on the inner peripheral side of first annular projecting portion 53.

In this case, when assembly 20 including terminal member 5 and joining member 4 is disposed on the electrode of the semiconductor element and joining member 4 is heated as described above, melted joining member 4 may expand in volume. At this time, there is a concern that joining member 4 flows outside from the outer periphery of terminal member 5, or the distance between the electrode and terminal member 5 becomes larger than that before heating. However, when first through hole 52 is provided, a part of melted joining member 4 can flow into first through hole 52, so that occurrence of the above-described problem can be suppressed.

Furthermore, by a part of joining member 4 flowing into first through hole 52 to be re-solidified, the joining area between joining member 4 and terminal member 5 can be increased as a result as compared with the case where first through hole 52 is not provided. In addition, since a state of joining member 4 can be observed through first through hole 52, a joining state between joining member 4 and terminal member 5 can be directly confirmed.

In terminal member 5, conductor portion 50 may have a multilayer structure including a plurality of layers laminated in a direction intersecting first main surface 50a. Layer 5b which is one of the plurality of layers may include invar.

In this case, since invar has a feature that a coefficient of thermal expansion near normal temperature is small, deformation of terminal member 5 can be suppressed in the step of pressing for providing assembly 20 as illustrated in FIG. 10. By suppressing deformation of terminal member 5 in this manner, first annular projecting portion 53 or projecting portion 51 easily bites into joining member 4. As a result, it is possible to improve bonding strength of joining member 4 to terminal member 5.

Assembly 20 according to the present disclosure includes terminal member 5 and joining member 4. Joining member 4 is connected to first main surface 50a of terminal member 5. First annular projecting portion 53 of terminal member 5 bites into joining member 4.

In this way, for example, when terminal member 5 is joined to the electrode of the semiconductor element using assembly 20, terminal member 5 and joining member 4 can be handled as one component as assembly 20. As a result, it is possible to improve workability in the manufacturing process of the semiconductor device.

In addition, since first annular projecting portion 53 is provided, the joining area between terminal member 5 and joining member 4 can be made larger than the case where first annular projecting portion 53 is not provided. Furthermore, since first annular projecting portion 53 is provided, when joining member 4 is melted and re-solidified, the distance between terminal member 5 and the electrode (that is, the thickness of joining member 4) can be maintained at a certain size.

In a method for manufacturing terminal member 5 according to the present disclosure, a step of preparing conductor portion 50 is performed. Conductor portion 50 has first main surface 50a and second main surface 50b located on the side opposite to first main surface 50a. In the method for manufacturing terminal member 5, the step of providing first protrusion 57a and the step of providing first annular projecting portion 53 are performed. In the step of providing first protrusion 57a, first protrusion 57a is provided on first main surface 50a by press working to conductor portion 50. In the step of providing first annular projecting portion 53, by providing first through hole 52 penetrating conductor portion 50 in first protrusion 57a, first annular projecting portion 53 having an annular shape in planar view is provided.

In this way, terminal member 5 according to the present disclosure including first annular projecting portion 53 and first through hole 52 is obtained.

In the method for manufacturing the terminal member, in the step of providing first protrusion 57a, first protrusion 57a may be provided by providing first recess 57b on second main surface 50b by press working to second main surface 50b. The step of providing first annular projecting portion 53 may include providing protruding portion 57c and providing first through hole 52. In the step of providing protruding portion 57c, by performing press working to first recess 57b, second recess 57d to be first through hole 52 extending from the inside of first recess 57b toward the inside of the first protrusion 57a may be provided, and protruding portion 57c protruding from the first protrusion 57a in the extending direction of second recess 57d may be provided. In the step of providing first through hole 52, first through hole 52 may be provided by removing protruding portion 57c from the first protrusion 57a to provide an opening continuous with second recess 57d in the surface of the first protrusion 57a.

In this case, terminal member 5 according to the present disclosure including first annular projecting portion 53 and first through hole 52 is obtained by using press working.

A method for manufacturing assembly 20 according to the present disclosure includes: arranging joining member 4 on surface 6a of support base 6; arranging terminal member 5; and pressing. In the step of arranging terminal member 5, terminal member 5 is disposed on joining member 4. In the step of arranging terminal member 5, terminal member 5 is arranged such that first main surface 50a of terminal member 5 faces joining member 4. In the step of pressing, terminal member 5 is relatively pressed against joining member 4. In the step of pressing, first annular projecting portion 53 of terminal member 5 bites into joining member 4.

In this way, assembly 20 according to the present disclosure is obtained.

Configurations of First Modification of Terminal Member and Assembly

Figure 11:
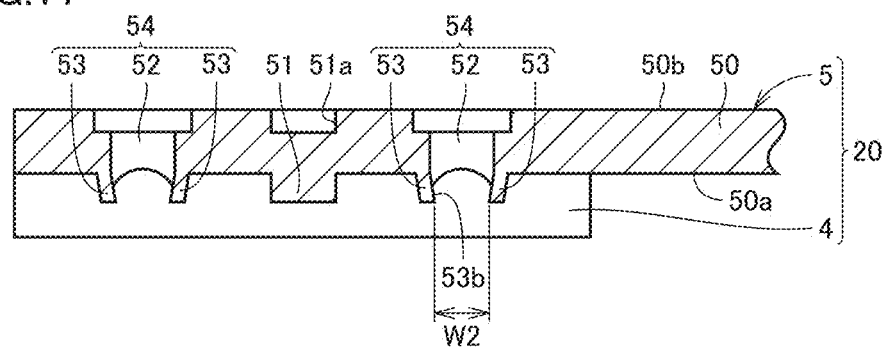
FIG. 11 is a schematic cross-sectional view for illustrating a first modification of the assembly shown in FIG. 1.

FIG. 11 is a schematic cross-sectional view for illustrating a first modification of the assembly shown in FIG. 1. Assembly 20 and terminal member 5 shown in FIG. 11 basically have the same configuration as assembly 20 and terminal member 5 shown in FIGS. 1 and 2, but the shape of first annular projecting portion 53 is different from assembly 20 and terminal member 5 shown in FIGS. 1 and 2. That is, in terminal member 5 constituting assembly 20 shown in FIG. 11, the inclination direction of first annular projecting portion 53 is opposite to the inclination direction of first annular projecting portion 53 in assembly 20 shown in FIG. 2. From a different point of view, in assembly 20 shown in FIG. 11, an inner peripheral side surface 53b of first annular projecting portion 53 is inclined such that an inner peripheral width W2 of first annular projecting portion 53 decreases as the distance from first main surface 50a increases.

Operation and Effects

In terminal member 5 constituting assembly 20, first annular projecting portion 53 may have inner peripheral side surface 53b. Inner peripheral side surface 53b may be inclined with respect to first main surface 50a such that inner peripheral width W2 of first annular projecting portion 53 decreases as the distance from first main surface 50a increases.

Also in this case, when joining member 4 is pressed against first main surface 50a of terminal member 5, it is possible to cause first annular projecting portion 53 to bite into joining member 4 more firmly. As a result, it is possible to join joining member 4 to terminal member 5 more firmly.

Configurations of Second Modification of Terminal Member and Assembly

Figure 12:
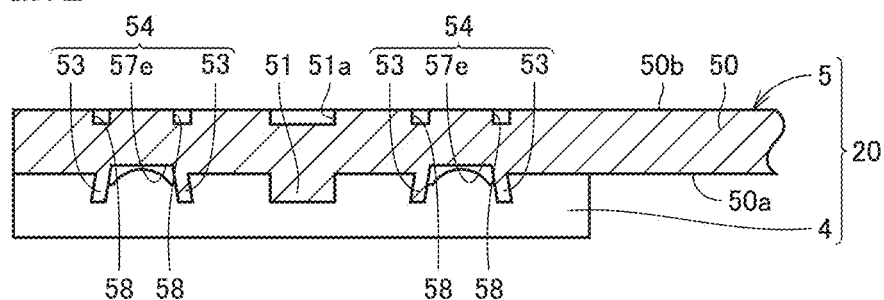
FIG. 12 is a schematic cross-sectional view for illustrating a second modification of the assembly shown in FIG. 1.

FIG. 12 is a schematic cross-sectional view for illustrating a second modification of the assembly shown in FIG. 1. Assembly 20 and terminal member 5 shown in FIG. 12 basically have the same configuration as assembly 20 and terminal member 5 shown in FIGS. 1 and 2, but the shape of caulking portion 54 is different from that of assembly 20 and terminal member 5 shown in FIGS. 1 and 2. That is, in terminal member 5 constituting assembly 20 shown in FIG. 12, a recess 57e is provided instead of first through hole 52 on the inner peripheral side of first annular projecting portion 53. In the assembly shown in FIG. 12, the shape of first annular projecting portion 53 may be the shape of first annular projecting portion 53 in the assembly shown in FIG. 11.

Method for Manufacturing Second Modification of Terminal Member

Figure 13:
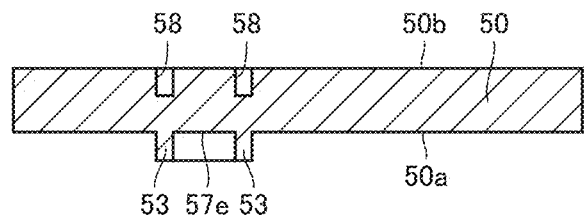
FIG. 13 is a schematic view for illustrating the method for manufacturing a terminal member constituting the assembly shown in FIG. 12.

FIG. 13 is a schematic view for illustrating the method for manufacturing the terminal member constituting the assembly shown in FIG. 12. The method for manufacturing terminal member 5 constituting the assembly shown in FIG. 12 is basically similar to the method for manufacturing terminal member 5 shown in FIGS. 6 to 9, but is different from the method for manufacturing terminal member 5 shown in FIGS. 6 to 9 in that first annular projecting portion 53 is provided by providing recess 57e without providing first through hole 52 (see FIG. 8). Hereinafter, a specific description will be given.

In the method for manufacturing terminal member 5 constituting assembly 20 illustrated in FIG. 12, first, a step of preparing conductor portion 50 to be the terminal member is performed. Next, the step of providing first protrusion 57a illustrated in FIG. 6 is performed. Thereafter, as illustrated in FIG. 13, recess 57e recessed toward second main surface 50b is provided in the surface of first protrusion 57a. Recess 57c can be provided by any method, but can be provided by, for example, press working. As a result, first annular projecting portion 53 is provided so as to surround the periphery of recess 57e. In addition, a protrusion corresponding to recess 57e is provided inside first recess 57b (see FIG. 6) on the second main surface of conductor portion 50 by press working to provide recess 57e described above. As a result, on the second main surface of conductor portion 50, an annular recess 58 is provided so as to surround the protrusion. Annular recess 58 is disposed at a position overlapping with first annular projecting portion 53.

Thereafter, by performing a step similar to the step shown in FIG. 9, terminal member 5 shown in FIG. 12 can be obtained. In addition, using terminal member 5 that has been obtained, assembly 20 shown in FIG. 12 can be obtained by a method similar to the method for manufacturing the assembly shown in FIG. 10. In assembly 20 shown in FIG. 12, similarly to assembly 20 shown in FIG. 11, inner peripheral side surface 53b of first annular projecting portion 53 may be inclined such that inner peripheral width W2 of first annular projecting portion 53 decreases as the distance from first main surface 50a increases. First through hole 52 as shown in FIG. 2 may be provided on the inner peripheral side of first annular projecting portion 53.

Operation and Effects

Terminal member 5 is terminal member 5 joined to an electrode of a semiconductor element, and includes conductor portion 50, first annular projecting portion 53, and annular recess 58. Conductor portion 50 has first main surface 50a and second main surface 50b located on the side opposite to first main surface 50a. First annular projecting portion 53 is provided on first main surface 50a of conductor portion 50. Annular recess 58 is provided on the second main surface. Annular recess 58 is disposed at a position overlapping with first annular projecting portion 53.

In terminal member 5, similarly to terminal member 5 of assembly 20 shown in FIGS. 1 and 2, when joining member 4 is pressed against first main surface 50a of terminal member 5, it is possible to cause first annular projecting portion 53 to bite into joining member 4 firmly. As a result, it is possible to join joining member 4 to terminal member 5 more firmly.

In the method for manufacturing terminal member 5 constituting assembly 20 illustrated in FIG. 12, a step of preparing conductor portion 50 is performed. As illustrated in FIG. 6 or 13, conductor portion 50 has first main surface 50a and second main surface 50b located on the side opposite to first main surface 50a. In the method for manufacturing terminal member 5, the step of providing first protrusion 57a illustrated in FIG. 6 and the step of providing first annular projecting portion 53 illustrated in FIG. 13 are performed. In the step of providing first protrusion 57a, first protrusion 57a is provided on first main surface 50a by press working to conductor portion 50. In the step of providing first annular projecting portion 53 illustrated in FIG. 13, a part of first protrusion 57a (see FIG. 6) is pressed toward second main surface 50b to provide first annular projecting portion 53 having an annular shape in planar view. In the step of providing first annular projecting portion 53, annular recess 58 is provided at a position on second main surface 50b overlapping with first annular projecting portion 53. Thereafter, a step similar to the step shown in FIG. 9 is performed. In this way, terminal member 5 constituting assembly 20 illustrated in FIG. 12 can be obtained.

Second Embodiment

Configurations of Terminal Member and Assembly

Figure 14:
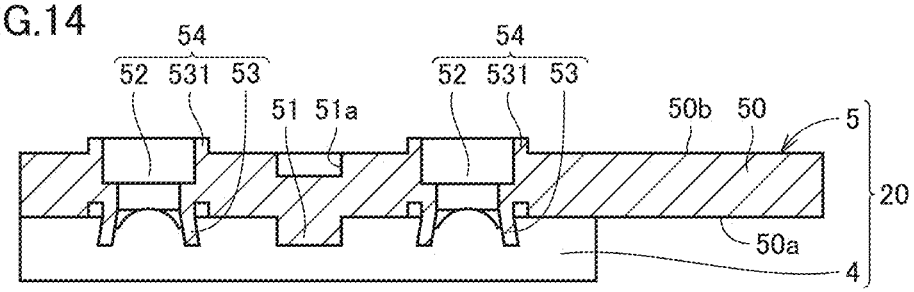
FIG. 14 is a schematic cross-sectional view of an assembly according to a second embodiment.

FIG. 14 is a schematic cross-sectional view of an assembly according to a second embodiment. Assembly 20 shown in FIG. 14 basically has the same configuration as assembly 20 shown in FIGS. 1 and 2, but the configuration of terminal member 5 constituting assembly 20 is different from that of assembly 20 shown in FIGS. 1 and 2. Specifically, in assembly 20 shown in FIG. 14, a second annular projecting portion 531 is provided on second main surface 50b of terminal member 5. Second annular projecting portion 531 has an annular shape in planar view. Second annular projecting portion 531 is provided at a position on second main surface 50b overlapping with first annular projecting portion 53 when viewed from a direction perpendicular to second main surface 50b. More specifically, when viewed from the direction perpendicular to second main surface 50b, a region where second annular projecting portion 531 is provided (a region surrounded by second annular projecting portion 531) and a region where first annular projecting portion 53 is provided (a region surrounded by first annular projecting portion 53) overlap with each other. In terminal member 5 shown in FIG. 14, when viewed from the direction perpendicular to second main surface 50b, the region where first annular projecting portion 53 is provided is included in the region where second annular projecting portion 531 is provided. That is, the outer peripheral width of second annular projecting portion 531 is larger than the outer peripheral width of first annular projecting portion 53.

The width (inner diameter) of the region of first through hole 52 on the inner peripheral side of second annular projecting portion 531 is larger than the width (inner diameter) of the region of first through hole 52 on the inner peripheral side of first annular projecting portion 53. A groove is provided around first annular projecting portion 53 on first main surface 50a so as to surround first annular projecting portion 53.

Sizes of first annular projecting portion 53 and first through hole 52 are basically the same as the sizes of first annular projecting portion 53 and first through hole 52 in terminal member 5 of assembly 20 shown in FIGS. 1 and 2. The outer peripheral width of second annular projecting portion 531 may be, for example, greater than or equal to 1 mm and less than or equal to 3 mm, greater than or equal to 1.5 mm and less than or equal to 2.8 mm, or greater than or equal to 2.0 mm and less than or equal to 2.5 mm. The height of second annular projecting portion 531 may be, for example, greater than or equal to 0.1 mm and less than or equal to 0.3 mm, or may be greater than or equal to 0.15 mm and less than or equal to 0.20 mm.

The outer peripheral width of first annular projecting portion 53 may be, for example, greater than or equal to 1 mm and less than or equal to 2.5 mm, or may be greater than or equal to 1.5 mm and less than or equal to 2.0 mm. The height of first annular projecting portion 53 may be, for example, greater than or equal to 0.1 mm and less than or equal to 0.4 mm, greater than or equal to 0.15 mm and less than or equal to 0.35 mm, or greater than or equal to 0.3 mm and less than or equal to 0.35 mm. As for a size of caulking portion 54 including first annular projecting portion 53, second annular projecting portion 531, and first through hole 52, any value can be selected as long as joint strength between terminal member 5 and joining member 4 can be improved by causing first annular projecting portion 53 to bite into joining member 4.

In assembly 20 shown in FIG. 14, for example, when the size of joining member 4 needs to be reduced, only caulking portion 54 may be provided in terminal member 5 without providing projecting portion 51. In this case, the height of first annular projecting portion 53 may be appropriately adjusted in order to secure, by first annular projecting portion 53, the distance between terminal member 5 and the electrode of the semiconductor element to which terminal member 5 is connected (the thickness of joining member 4). For example, when the thickness of joining member 4 is about 0.4 mm, the height of first annular projecting portion 53 may be greater than or equal to 0.3 mm and less than or equal to 0.35 mm.

Method for Manufacturing Terminal Member

FIGS. 15 to 19 are schematic views for illustrating a method for manufacturing the terminal member constituting the assembly illustrated in FIG. 14. The method for manufacturing terminal member 5 constituting assembly 20 shown in FIG. 14 is basically similar to the method for manufacturing terminal member 5 shown in FIGS. 6 to 9, but is different from the method for manufacturing terminal member 5 shown in FIGS. 6 to 9 in that a step of providing second protrusion 57h on second main surface 50b is performed, and that second annular projecting portion 531 is provided on second main surface 50b. Hereinafter, a specific description will be given. Similarly to FIGS. 6 to 9, FIGS. 15 to 19 illustrate only a region where a pair of first annular projecting portion 53 and second annular projecting portion 531 are provided in order to simplify the description.

Figure 15:
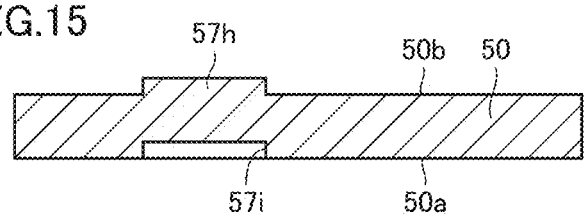
FIG. 15 is a schematic view for illustrating the method for manufacturing a terminal member constituting the assembly shown in FIG. 14.

First, as illustrated in FIG. 15, prior to provision of first protrusion 57a on first main surface 50a to be described later (see FIG. 16), second protrusion 57h is provided on second main surface 50b. Second protrusion 57h is provided by press working to first main surface 50a of conductor portion 50. Along with the provision of second protrusion 57h, a recess 57i is provided on first main surface 50a. When viewed from the direction perpendicular to second main surface 50b, second protrusion 57h is disposed at a position overlapping with recess 57i.

Figure 16:
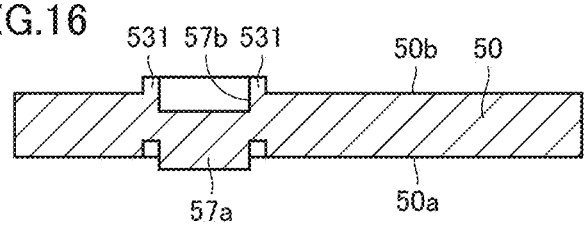
FIG. 16 is a schematic view for illustrating the method for manufacturing the terminal member constituting the assembly shown in FIG. 14.

Next, as illustrated in FIG. 16, first protrusion 57a is provided on first main surface 50a of conductor portion 50. The step shown in FIG. 16 is basically similar to the step shown in FIG. 6. However, press working for providing first protrusion 57a is performed to second protrusion 57h on second main surface 50b of conductor portion 50. As a result, first recess 57b is provided at the central portion of second protrusion 57h, and second annular projecting portion 531 is provided so as to surround first recess 57b. That is, by providing first recess 57b on second protrusion 57h, first protrusion 57a is provided on first main surface 50a, and second annular projecting portion 531 is provided on second main surface 50b.

Figure 17:
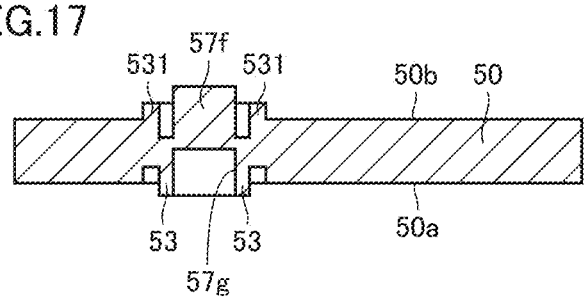
FIG. 17 is a schematic view for illustrating the method for manufacturing the terminal member constituting the assembly shown in FIG. 14.

Next, as illustrated in FIG. 17, by performing press working to first protrusion 57a, a recess 57g is provided in first protrusion 57a. That is, recess 57g is provided by performing press working to the side of second main surface 50b at the center of first protrusion 57a. As a result, first annular projecting portion 53 is provided around recess 57g. Along with the provision of recess 57g, a protrusion 57f protruding toward second main surface 50b is provided on the inner peripheral side of second annular projecting portion 531.

Figure 18:
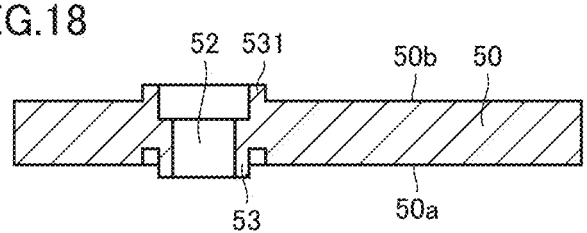
FIG. 18 is a schematic view for illustrating the method for manufacturing the terminal member constituting the assembly shown in FIG. 14.

Next, as illustrated in FIG. 18, first through hole 52 is provided by removing protrusion 57f from conductor portion 50.

Figure 19:
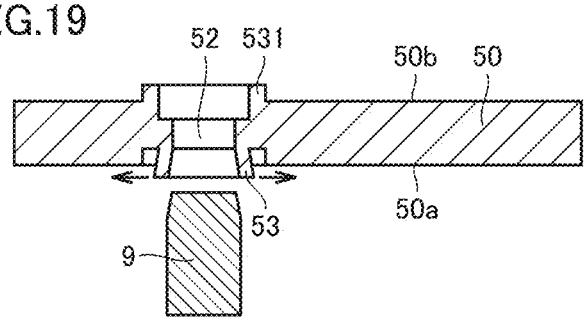
FIG. 19 is a schematic view for illustrating the method for manufacturing the terminal member constituting the assembly shown in FIG. 14.

Next, as illustrated in FIG. 19, a step of radially deforming first annular projecting portion 53 is performed. This step is basically similar to the step shown in FIG. 9. In this way, terminal member 5 constituting assembly 20 illustrated in FIG. 14 can be obtained.

Note that the order of the above-described steps may be appropriately changed. For example, by providing second protrusion 57h and first recess 57b illustrated in FIGS. 15 and 16 after the step of providing first through hole 52 is performed first, first annular projecting portion 53 may be provided on first main surface 50a, and second annular projecting portion 531 may be provided on second main surface 50b. Further, the steps illustrated in FIG. 19 may be omitted. In addition, the step of obtaining terminal member 5 from the plate-shaped member by press working may be performed simultaneously with any of the steps described above. The step of providing projecting portion 51 may be performed simultaneously with any of the steps described above. For example, projecting portion 51 may be provided simultaneously with the process illustrated in FIG. 16. Further, terminal member 5 may be configured such that recess 57g is provided on the inner peripheral side of first annular projecting portion 53, without removing protrusion 57f illustrated in FIG. 17 from conductor portion 50.

Method for Manufacturing Assembly

Figure 20:
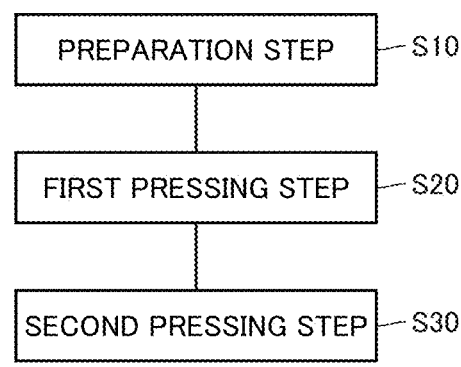
FIG. 20 is a flowchart for illustrating a method for manufacturing the assembly shown in FIG. 14.

FIG. 20 is a flowchart for illustrating a method for manufacturing the assembly shown in FIG. 14. The method for manufacturing assembly 20 shown in FIG. 14 is basically similar to the method for manufacturing assembly 20 shown in FIGS. 1 and 2, but is different from the method for manufacturing assembly 20 shown in FIGS. 1 and 2 in that two pressing steps of a first pressing step (S20) and a second pressing step (S30) are provided Hereinafter, the method for manufacturing assembly 20 will be described with reference to FIGS. 20 and 10.

As shown in FIG. 20, first, a preparation step (S10) is performed. In this step (S10), as shown in FIG. 10, joining member 4 constituting assembly 20 shown in FIG. 14 is disposed on surface 6a of support base 6. Further, in this step (S10), terminal member 5 is disposed on joining member 4. At this time, terminal member 5 is disposed such that first main surface 50a of terminal member 5 faces joining member 4.

Next, the first pressing step (S20) as a step of pressing is performed. In this step (S20), terminal member 5 is relatively pressed against joining member 4 by pressing member 7. As a result, first annular projecting portion 53 of terminal member 5 bites into joining member 4. For example, when the thickness of joining member 4 is about 0.4 mm, first annular projecting portion 53 may bite into joining member 4 by about 0.15 mm in this step (S20).

Next, the second pressing step (S30) as a step of pressing second annular projecting portion 531 is performed. In this step (S30), after the above step (S20), second annular projecting portion 531 of terminal member 5 is pressed by pressing member 7 toward a side of joining member 4. By pressing second annular projecting portion 531 to locally press terminal member 5 against joining member 4 in this manner, first annular projecting portion 53 can reliably bite into joining member 4. For example, first annular projecting portion 53 may bite into joining member 4 by about 0.3 mm. In this way, assembly 20 shown in FIG. 14 is obtained.

Operation and Effects

In terminal member 5, conductor portion 50 may have second main surface 50b located on the side opposite to first main surface 50a. Terminal member 5 may include second annular projecting portion 531. Second annular projecting portion 531 may be provided at a position on second main surface 50b overlapping with first annular projecting portion 53 when viewed from the direction perpendicular to second main surface 50b. Second annular projecting portion 531 may have an annular shape in planar view.

In this case, when terminal member 5 is pressed against joining member 4, pressure can be locally applied to terminal member 5 by pressing second annular projecting portion 531. Since second annular projecting portion 531 is disposed at a position overlapping with first annular projecting portion 53, first annular projecting portion 53 can reliably bite into joining member 4 as a result. Therefore, it is possible to improve joint strength between terminal member 5 and joining member 4.

The method for manufacturing terminal member 5 may include a step of providing second protrusion 57h as illustrated in FIG. 15. In the step of providing second protrusion 57h, prior to the step of providing first protrusion 57a illustrated in FIG. 16, second protrusion 57h is provided on second main surface 50b by press working to conductor portion 50. In the step of providing first protrusion 57a illustrated in FIG. 16, by providing first recess 57b on second protrusion 57h, first protrusion 57a may be provided, and second annular projecting portion 531 may be provided on second main surface 50b.

In this way, terminal member 5 constituting assembly 20 illustrated in FIG. 14 can be obtained.

A method for manufacturing an assembly according to the present disclosure includes arranging joining member 4 on a surface of a support base 6 (preparation step (S10)), arranging terminal member 5 (preparation step (S10)), and pressing (first pressing step (S20)). In the step of arranging terminal member 5, terminal member 5 is disposed on joining member 4. In the step of arranging terminal member 5, terminal member 5 is arranged such that first main surface 50a of terminal member 5 faces joining member 4. In the first pressing step (S20), terminal member 5 is pressed relatively against joining member 4. In the first pressing step (S20), first annular projecting portion 53 of terminal member 5 bites into joining member 4. The method for manufacturing assembly 20 further includes pressing second annular projecting portion 531 (second pressing step (S30)). In the second pressing step (S30), after the first pressing step (S20), second annular projecting portion 531 of terminal member 5 is pressed toward joining member 4.

In this case, assembly 20 shown in FIG. 14 is obtained. In addition, it is possible to improve joint strength between terminal member 5 and joining member 4 constituting assembly 20.

Third Embodiment

Configuration of Terminal Member

Figure 21:
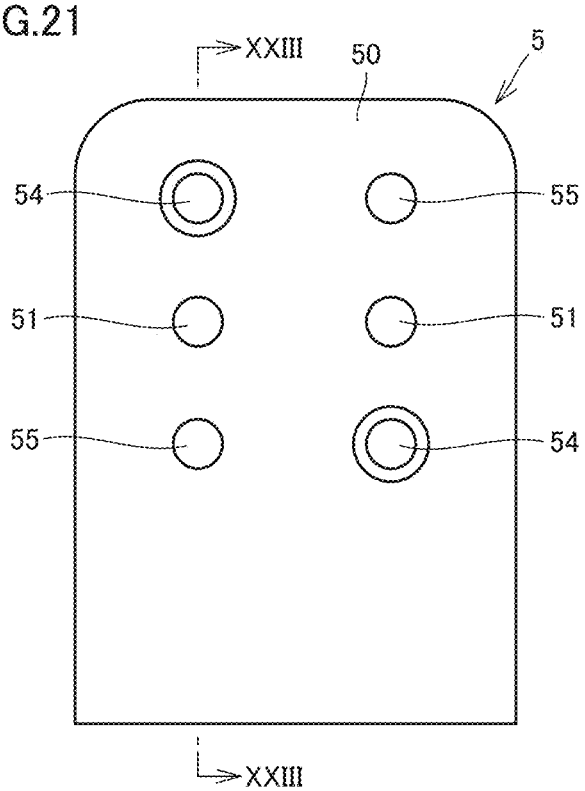
FIG. 21 is a schematic plan view of a terminal member according to a third embodiment.
Figure 22:
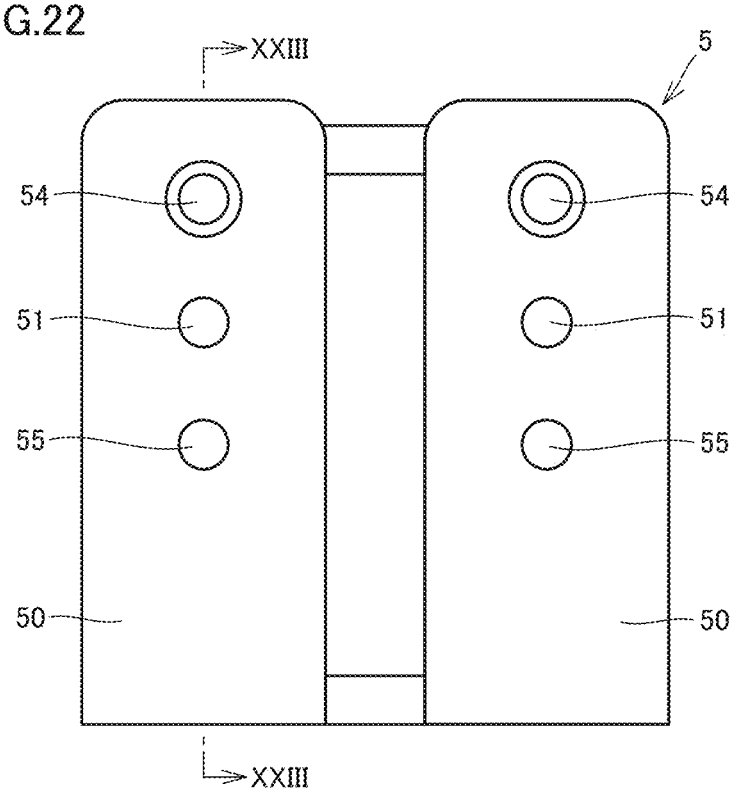
FIG. 22 is a schematic plan view of a modification of the terminal member according to the third embodiment.
Figure 23:
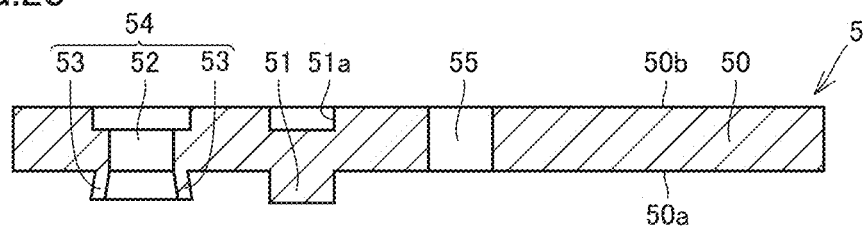
FIG. 23 is a schematic cross-sectional view taken along line XXIII-XXIII in FIGS. 21 and 22.

FIG. 21 is a schematic plan view of a terminal member according to a third embodiment. FIG. 22 is a schematic plan view of a modification of the terminal member according to the third embodiment. FIG. 23 is a schematic cross-sectional view taken along line XXIII-XXIII in FIGS. 21 and 22. Terminal member 5 illustrated in FIGS. 21 to 23 illustrates a configuration example applied to a case in which an area of the region where terminal member 5 is joined to the electrode by joining member 4 is large.

In terminal member 5 illustrated in FIGS. 21 and 23, two rows in each of which caulking portion 54, projecting portion 51, and second through hole 55 are arranged are provided. The configurations of caulking portion 54 and projecting portion 51 are similar to the configurations of caulking portion 54 and projecting portion 51 of terminal member 5 in assembly 20 illustrated in FIGS. 1 and 2. First annular projecting portion 53 such as caulking portion 54 is not provided in second through hole 55. In the two rows, the order in which caulking portion 54, projecting portion 51, and second through hole 55 are arranged is opposite to each other. In the two rows, the order in which caulking portion 54, projecting portion 51, and second through hole 55 are arranged may be the same. Joining member 4 (see FIG. 2) is joined to a region overlapping with the row including caulking portion 54 described above. The size of joining member 4 in this case is larger than the size of joining member 4 in assembly 20 shown in FIGS. 1 and 2.

Terminal member 5 illustrated in FIGS. 22 and 23 is a member in which a plurality of terminal members are coupled, and a row in which caulking portion 54, projecting portion 51, and second through hole 55 are arranged is provided in each terminal member. The configurations of caulking portion 54 and projecting portion 51 are similar to the configurations of caulking portion 54 and projecting portion 51 of terminal member 5 in assembly 20 illustrated in FIGS. 1 and 2. A joining member is joined to each terminal member.

As described above, the number of the caulking portions 54 and projecting portion 51 can be increased according to the size or the number of joining member 4. On the other hand, there is a limit in pressurizing capability of the device used for joining terminal member 5 and joining member 4 (a device including support base 6 and pressing member 7 as illustrated in FIG. 10). Therefore, there is a limit to the number of portions (the number of caulking portion 54) that can be caulked by pressing once.

Therefore, in terminal member 5 illustrated in FIGS. 21 to 22, second through hole 55 having no first annular projecting portion 53 is provided. Since first annular projecting portion 53 is not provided in such second through hole 55, it is possible to suppress occurrence of a problem that the number of caulking portions is too large to apply a necessary pressure to first annular projecting portion 53 when terminal member 5 is pressed against and joined to joining member 4 for joining.

As the configuration of caulking portion 54 described above, the configuration of caulking portion 54 of terminal member 5 illustrated in FIG. 14 may be adopted. The number of caulking portion 54 may be 3 or more. Projecting portion 51 in each row may not be provided. Alternatively, caulking portion 54 or second through hole 55 may be further provided instead of projecting portion 51. In addition, instead of first through hole 52, recess 57e illustrated in FIG. 12 may be provided on the inner peripheral side of first annular projecting portion 53. As shown in FIG. 12, annular recess 58 may be provided at a position on second main surface 50b overlapping with first annular projecting portion 53.

Method for Manufacturing Terminal Member

Figure 24:
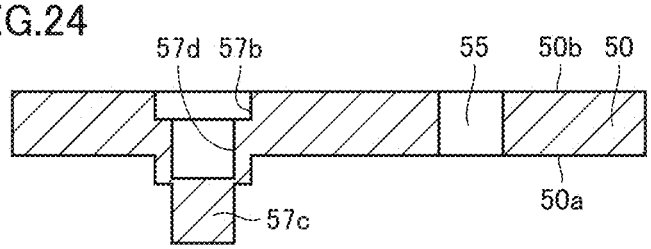
FIG. 24 is a schematic view for illustrating a method for manufacturing the terminal member shown in FIG. 21.

FIG. 24 is a schematic view for illustrating the method for manufacturing the terminal member shown in FIG. 21. In FIG. 24, only a portion to be caulking portion 54 (see FIG. 21) and a region where second through hole 55 is provided are illustrated in order to simplify the description.

The method for manufacturing the terminal member illustrated in FIG. 21 is basically similar to the method for manufacturing terminal member 5 illustrated in FIGS. 6 to 9. but is different from the method for manufacturing terminal member 5 illustrated in FIGS. 6 to 9 in that second through hole 55 is provided at the same time in the step of providing second recess 57d. Hereinafter, description will be made.

In the method for manufacturing terminal member 5 illustrated in FIG. 21, first, a step of preparing conductor portion 50 to be the terminal member is performed. Next, the step of providing first protrusion 57a illustrated in FIG. 6 is performed. Thereafter, as illustrated in FIG. 24, a step of providing protruding portion 57c is performed. In the step of providing protruding portion 57c, press working to first recess 57b is performed. As a result, a second recess 57d that extends from the inside of first recess 57b toward the inside of first protrusion 57a and is to be first through hole 52 (see FIG. 8) is provided. At the same time, second through hole 55 is provided by performing press working to conductor portion 50. By providing second recess 57d in this manner, protruding portion 57c protruding from first protrusion 57a in the extending direction of second recess 57d is provided as a result.

Thereafter, terminal member 5 illustrated in FIG. 21 can be obtained by performing a step similar to the step illustrated in FIGS. 8 and 9. In addition, using terminal member 5 that has been obtained, assembly 20 in which joining member 4 is joined to terminal member 5 can be obtained by a method similar to the method for manufacturing the assembly shown in FIG. 10.

Operation and Effects

In terminal member 5, conductor portion 50 may be provided with second through hole 55 at a position away from first annular projecting portion 53.

In this case, since second through hole 55 is a simple through hole and is not provided with first annular projecting portion 53, it is possible to suppress occurrence of a problem that the number of caulking portions is too large to apply a necessary pressure to first annular projecting portion 53 when terminal member 5 is pressed against and joined to joining member 4 for joining.

In addition, when assembly 20 including terminal member 5 and joining member 4 is disposed on the electrode of the semiconductor element and joining member 4 is heated, melted joining member 4 may expand in volume. At this time, there is a concern that joining member 4 flows outside from the outer periphery of terminal member 5, or the distance between the electrode and terminal member 5 becomes larger than that before heating. However, when second through hole 55 is provided, a part of melted joining member 4 can flow into second through hole 55, so that occurrence of the above-described problem can be suppressed.

Furthermore, by a part of joining member 4 flowing into second through hole 55 to be re-solidified, the joining area between joining member 4 and terminal member 5 can be increased as a result as compared with the case where second through hole 55 is not provided. In addition, since the state of joining member 4 can be observed through second through hole 55, the joining state between joining member 4 and terminal member 5 can be directly confirmed.

Fourth Embodiment

Method for Manufacturing Assembly

Figure 25:
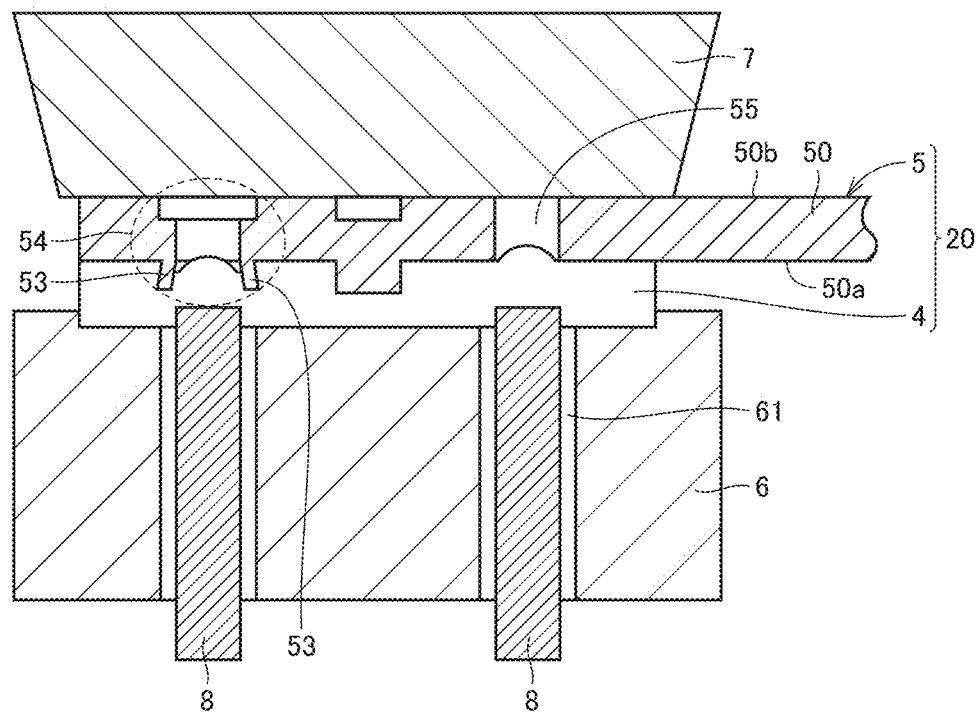
FIG. 25 is a schematic view for illustrating a method for manufacturing an assembly according to a fourth embodiment.

FIG. 25 is a schematic view for illustrating the method for manufacturing an assembly according to a fourth embodiment. The method for manufacturing assembly 20 shown in FIG. 25 is basically similar to the method for manufacturing assembly 20 shown in FIGS. 1 and 2, but the configuration of terminal member 5 to be used and the configuration of the device used for the caulking are different. Terminal member 5 used in the assembly manufacturing method shown in FIG. 25 has the same configuration as terminal member 5 shown in FIGS. 21 and 23. The device used in the method for manufacturing assembly 20 illustrated in FIG. 25 is a caulking device, and the basic configuration is similar to that of the device illustrated in FIG. 10. However, in the device shown in FIG. 25, a through hole 61 is provided in support base 6, and a rod-shaped member 8 is disposed inside through hole 61. Rod-shaped member 8 is movable inside through hole 61. Hereinafter, the method for manufacturing assembly 20 will be described.

In the method for manufacturing assembly 20 shown in FIG. 25, first, a step of arranging joining member 4 on the surface of support base 6 is performed.

Next, a step of arranging terminal member 5 is performed. In this step, terminal member 5 is disposed such that first main surface 50a of terminal member 5 faces joining member 4. At this time, terminal member 5 is preferably supported by a support member that is not illustrated. As the support member, for example, a robot arm may be used, or a jig having a support portion that supports terminal member 5 may be used.

Here, on the surface of support base 6, through hole 61 is provided at a position overlapping with first annular projecting portion 53 of terminal member 5 in a state where terminal member 5 is disposed on joining member 4. Another through hole 61 is also provided at a position overlapping with second through hole 55 of terminal member 5. Rod-shaped member 8 is movably inserted into another through hole 61. As means for moving rod-shaped member 8, a fluid cylinder, a motor, or any other driving device can be used.

When joining member 4 is disposed on the surface of support base 6, rod-shaped member 8 may not yet protrude from the surface of support base 6. Alternatively, rod-shaped member 8 may be protruding from the surface of support base 6.

Next, a step of pressing is performed. In this step, rod-shaped member 8 presses joining member 4 toward terminal member 5, and pressing member 7 presses terminal member 5 against joining member 4. As a result, as illustrated in FIG. 25, first annular projecting portion 53 of terminal member 5 bites into joining member 4. Further, a part of joining member 4 bites within second through hole 55. In this way, it is possible to obtain assembly 20 in which joint strength between terminal member 5 and joining member 4 is improved.

In the method for manufacturing assembly 20 described above, terminal member 5 constituting assembly 20 according to the first embodiment or the second embodiment may be used.

Operation and Effects

The method for manufacturing assembly 20 according to the present disclosure includes; arranging joining member 4 on the surface of support base 6; arranging terminal member 5; and pressing. In the step of arranging terminal member 5, terminal member 5 is disposed on joining member 4. In the step of arranging terminal member 5, terminal member 5 is arranged such that first main surface 50a of terminal member 5 faces joining member 4. Through hole 61 is provided on the surface of support base 6 at a position overlapping with first annular projecting portion 53 of terminal member 5 in a state where terminal member 5 is disposed on joining member 4 in the step of arranging terminal member 5. Support base 6 includes rod-shaped member 8 movably inserted into through hole 61. In the pressing step, joining member 4 is pressed toward terminal member 5 by rod-shaped member 8, and terminal member 5 is relatively pressed against joining member 4. In the step of pressing, first annular projecting portion 53 of terminal member 5 bites into joining member 4.

In this way, in the pressing step, in addition to the pressure caused by terminal member 5 being pressed against joining member 4, the pressure caused by rod-shaped member 8 pressing joining member 4 can also be applied to the region where first annular projecting portion 53 comes into contact with joining member 4. Therefore, first annular projecting portion 53 can reliably bite into joining member 4. As a result, it is possible to improve joint strength between terminal member 5 and joining member 4 in assembly 20.

Fifth Embodiment

Method for Manufacturing Assembly

Figure 26:
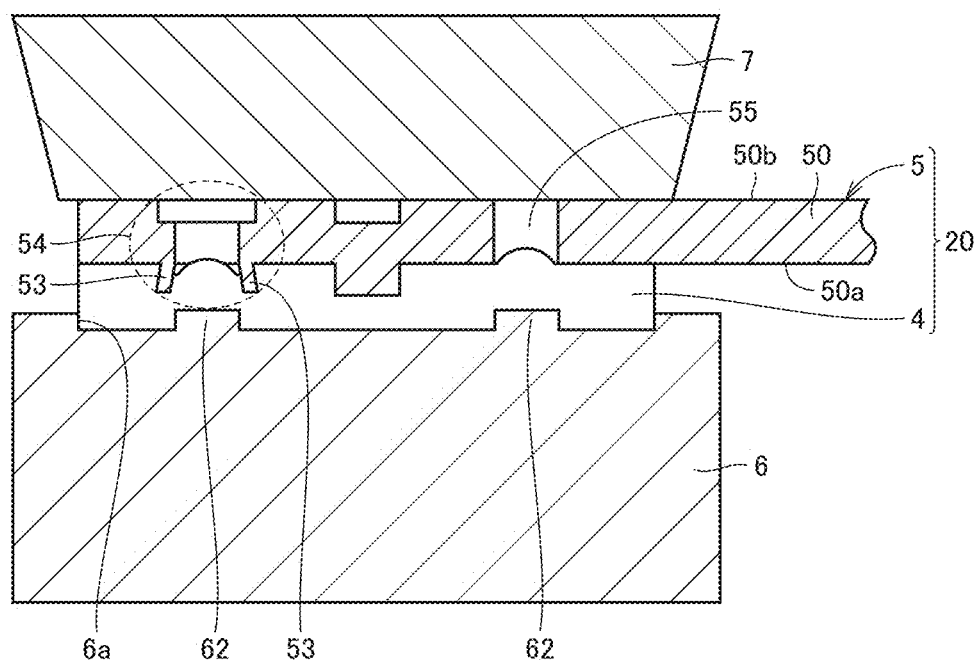
FIG. 26 is a schematic view for illustrating a method for manufacturing an assembly according to a fifth embodiment.

FIG. 26 is a schematic view for illustrating the method for manufacturing an assembly according to a fifth embodiment. The method for manufacturing assembly 20 shown in FIG. 26 is basically similar to the method for manufacturing assembly 20 shown in FIG. 25, but the configuration of the device used for caulking is different. The basic configuration of the device used in the method for manufacturing assembly 20 illustrated in FIG. 26 is similar to that of the device illustrated in FIG. 25. However, in the device shown in FIG. 26, through hole 61 is not provided in support base 6, and a protrusion 62 is provided on the surface of support base 6 on which joining member 4 is mounted. Hereinafter, the method for manufacturing assembly 20 will be described.

In the method for manufacturing assembly 20 shown in FIG. 26, first, a step of arranging joining member 4 on surface 6a which is the recess of support base 6 is performed.

Next, a step of arranging terminal member 5 is performed. In this step, terminal member 5 is disposed such that first main surface 50a of terminal member 5 faces joining member 4. At this time, terminal member 5 is preferably supported by a support member that is not illustrated. As the support member, for example, a robot arm may be used, or a jig having a support portion that supports terminal member 5 may be used.

Here, on the surface of support base 6, protrusion 62 is provided at a position overlapping with first annular projecting portion 53 of terminal member 5 in a state where terminal member 5 is disposed on joining member 4. Further, another protrusion 62 is also provided at a position overlapping with second through hole 55 of terminal member 5.

Next, a step of pressing is performed. In this step, terminal member 5 is pressed against joining member 4 by pressing member 7. As a result, since protrusion 62 is provided, stress concentrates on a portion of joining member 4 that is in contact with protrusion 62. Therefore, as illustrated in FIG. 26, first annular projecting portion 53 of terminal member 5 reliably bites into joining member 4. Further, a part of joining member 4 bites within second through hole 55. In this way, it is possible to obtain assembly 20 in which joint strength between terminal member 5 and joining member 4 is improved.

In the method for manufacturing assembly 20 described above, terminal member 5 constituting assembly 20 according to the first embodiment or the second embodiment may be used.

In the method for manufacturing assembly 20 as described above, it is necessary to accurately position terminal member 5 with respect to support base 6. Such positioning can be performed, for example, by adjusting a support member such as a jig that is used when terminal member 5 is mounted on surface 6a of support base 6. In addition, once such adjustment of the support member is performed, high positional accuracy can be reproducibly maintained for terminal member 5 having the same configuration. Further, in the method for manufacturing assembly 20 described above, a simple flat plate shape can be adopted as the shape of joining member 4. Therefore, high positional accuracy of joining member 4 with respect to support base 6 is not required.

Operation and Effects

The method for manufacturing assembly 20 according to the present disclosure includes: arranging joining member 4 on the surface of support base 6; arranging terminal member 5; and pressing. In the step of arranging terminal member 5, terminal member 5 is disposed on joining member 4. In the step of arranging terminal member 5, terminal member 5 is arranged such that first main surface 50a of terminal member 5 faces joining member 4. Protrusion 62 is provided on the surface of support base 6. Protrusion 62 is provided at a position overlapping with first annular projecting portion 53 of terminal member 5 in a state where terminal member 5 is disposed on joining member 4 in the step of arranging terminal member 5. In the step of pressing, terminal member 5 is relatively pressed against joining member 4. In the step of pressing, first annular projecting portion 53 of terminal member 5 bites into joining member 4.

In this way, in the pressing step, by protrusion 62 coming into contact with the region of joining member 4 with which first annular projecting portion 53 comes into contact, a stress due to terminal member 5 being pressed against joining member 4 can be concentrated. Therefore, first annular projecting portion 53 can reliably bite into joining member 4. As a result, it is possible to improve joint strength between terminal member 5 and joining member 4 in assembly 20.

Sixth Embodiment

Method for Manufacturing Semiconductor Device

Figure 27:
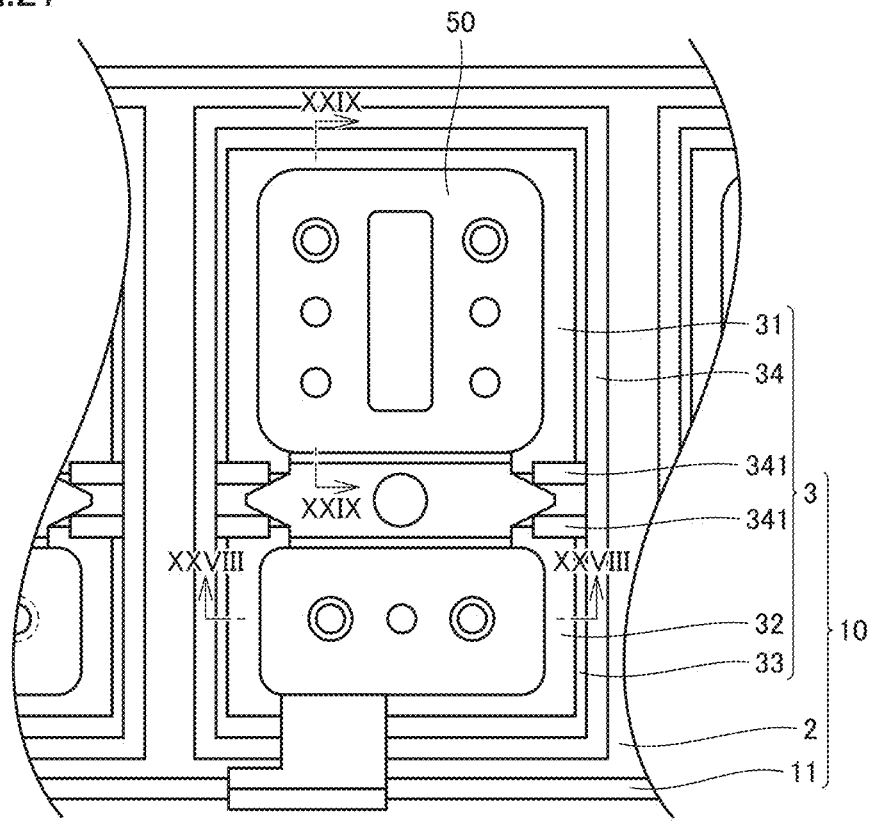
FIG. 27 is a schematic plan view for illustrating a method for manufacturing a semiconductor device according to a sixth embodiment.
Figure 28:
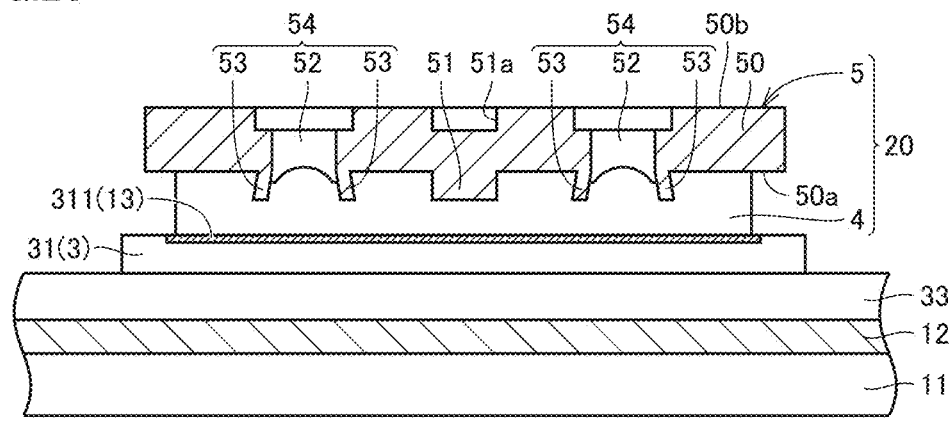
FIG. 28 is a schematic cross-sectional view taken along line XXVIII-XXVIII in FIG. 27.
Figure 29:
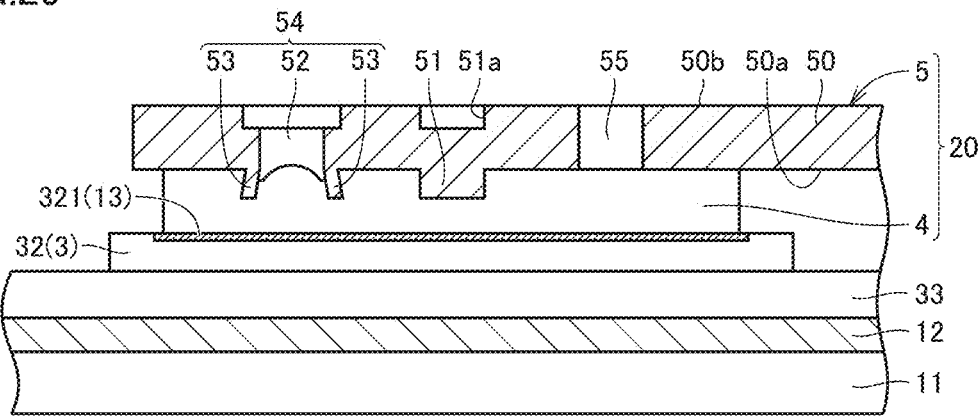
FIG. 29 is a schematic cross-sectional view taken along line XXIX-XXIX in FIG. 27.

FIG. 27 is a schematic plan view for illustrating the method for manufacturing the semiconductor device according to a sixth embodiment. FIG. 28 is a schematic cross-sectional view taken along line XXVIII-XXVIII in FIG. 27. FIG. 29 is a schematic cross-sectional view taken along line XXIX-XXIX in FIG. 27. The method for manufacturing a semiconductor device according to the present embodiment will be described with reference to FIGS. 27 to 29.

In the method for manufacturing the semiconductor device illustrated in FIGS. 27 to 29, a step of joining a heat spreader 11 to a back surface of a substrate 33 on which a semiconductor element 3 is mounted and joining terminal member 5 to an electrode 13 of semiconductor element 3 is performed.

Specifically, in the method for manufacturing the semiconductor device according to the present embodiment, a step of preparing semiconductor element 3 having electrode 13 is performed. In this step, semiconductor element 3 mounted on substrate 33 is prepared. Semiconductor element 3 is, for example, a power element constituting an inverter or a converter. In a semiconductor device 10 illustrated in FIGS. 27 to 29, an element 31 which is an Insulated Gate Bipolar Transistor (IGBT) and an element 32 which is a diode are used as semiconductor element 3. Semiconductor device 10 mainly includes elements 31 and 32 as semiconductor element 3, substrate 33 on which semiconductor element 3 is mounted, a frame 34 for controlling positions of elements 31 and 32, heat spreader 11 joined to substrate 33, and terminal member 5 joined to electrodes 311 and 321 of elements 31 and 32.

Next, a step of arranging is performed. In this step, substrate 33 is disposed on heat spreader 11 via a solder block 12 as a joining member. Solder block 12 is disposed in a recess provided in heat spreader 11. Elements 31 and 32 are mounted on a surface of substrate 33 opposite to the back surface facing heat spreader 11. A relative position of heat spreader 11 with respect to substrate 33 and elements 31, 32 is determined by a dedicated jig 2. Assembly 20 is disposed on electrodes 311 and 321 of elements 31 and 32. Assembly 20 is supported by a holding portion 341 of frame 34 illustrated in FIG. 27. As a method of supporting assembly 20, any method such as using another jig can be adopted.

Assembly 20 includes terminal member 5 and joining member 4. Terminal member 5 is terminal member 5 joined to electrodes 311 and 321 of elements 31 and 32, and includes conductor portion 50 and first annular projecting portion 53. That is, two caulking portions 54 and one projecting portion 51 are provided on terminal member 5 joined to electrode 311. Two caulking portions 54, two projecting portions 51, and two second through holes 55 are provided for terminal member 5 joined to electrode 321. In each terminal member 5, first annular projecting portion 53 included in caulking portion 54 is provided on first main surface 50a of conductor portion 50. Joining member 4 is connected to first main surface 50a of terminal member 5. First annular projecting portion 53 of terminal member 5 bites into joining member 4. In the step of arranging, assembly 20 is disposed such that joining member 4 of assembly 20 is in contact with electrodes 311 and 321.

In the step of arranging described above, assembly 20 is supported by frame 34 in the temporarily assembled state. Further, joining member 4 is temporarily fixed to terminal member 5 and constitutes assembly 20. The position of heat spreader 11 is defined by dedicated jig 2. Solder block 12 is disposed in the recess provided in heat spreader 11, and its position is defined. In this manner, the relative arrangement of the respective members that constitute semiconductor device 10 can be controlled.

Next, a step of connecting is performed. In this step, the temporarily assembled object including elements 31 and 32 is put into a heating furnace. As a result, by heating assembly 20, joining member 4 is melted and solidified, and connects terminal member 5 and electrodes 311 and 321 of semiconductor element 3. In addition, at this time, solder block 12 is also melted and solidified, and heat spreader 11 and substrate 33 are joined. In this way, a semiconductor device in which terminal member 5 is connected to electrodes 311 and 321 of elements 31 and 32 is obtained.

In the method for manufacturing the semiconductor device described above, assembly 20 including terminal member 5 disclosed in any one of the first embodiment to the third embodiment may be adopted.

In addition, the step of joining heat spreader 11 to substrate 33 may be performed as a step different from the step of connecting terminal member 5 to electrodes 311 and 321 described above. For example, heat spreader 11 may be joined to substrate 33 prior to the connecting step. Any method can be used for joining heat spreader 11 to substrate 33, and solder joining or sinterable metal joining may be used, for example. In this way, it is not necessary to position heat spreader 11 using dedicated jig 2 in the above-described arrangement step.

Configuration of Semiconductor Device

Figure 30:
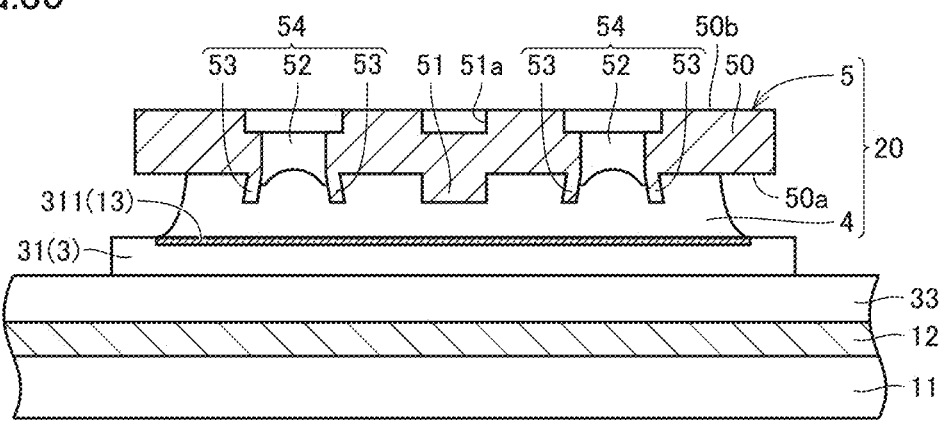
FIG. 30 is a schematic cross-sectional view of the semiconductor device according to the sixth embodiment.
Figure 31:
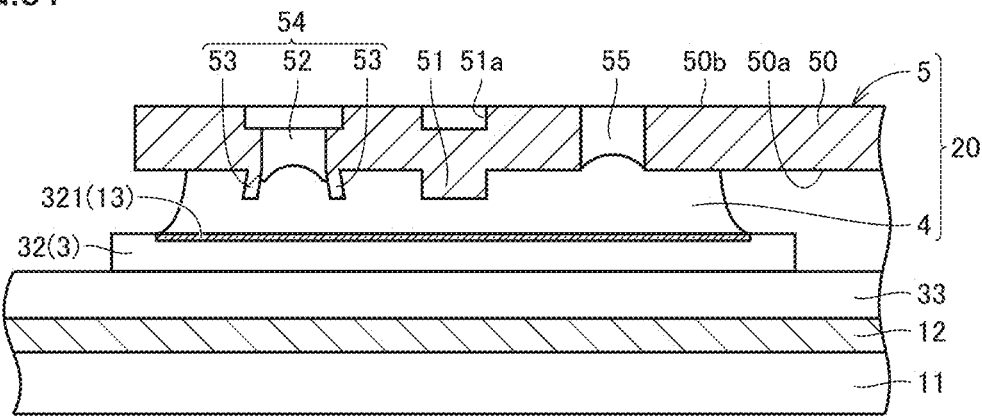
FIG. 31 is a schematic cross-sectional view of the semiconductor device according to the sixth embodiment.

FIGS. 30 and 31 are schematic cross-sectional views of a semiconductor device according to the sixth embodiment.

FIG. 30 corresponds to FIG. 28, and FIG. 31 corresponds to FIG. 29. As illustrated in FIGS. 30 and 31, in the semiconductor device, terminal member 5 is connected to electrodes 311 and 321 by joining member 4. Since joining member 4 is heated and melted and then solidified as described above, an end surface of the joining member has a curved shape and a shape extending obliquely with respect to the surface of electrodes 311 and 321 (so-called fillet shape). The end surface has a curved shape protruding inward. Further, a part of joining member 4 is disposed inside first through hole 52 and second through hole 55 of caulking portion 54.

Operation and Effects

The semiconductor device according to the present disclosure includes assembly 20 and semiconductor element 3 including electrode 13. Joining member 4 of assembly 20 is connected to electrode 13. In this case, since assembly 20 in which terminal member 5 and joining member 4 are integrated is used, when assembly 20 is disposed on electrode 13 for manufacturing a semiconductor device, workability is improved as compared with a case where terminal member 5 and joining member 4 are separate members.

A method for manufacturing semiconductor device 10 according to the present disclosure includes preparing, arranging, and connecting semiconductor element 3 having electrode 13. In the step of arranging, assembly 20 is disposed on electrode 13. In the step of arranging. assembly 20 is disposed such that joining member 4 of assembly 20 is in contact with electrode 13. In the step of connecting, terminal member 5 and electrode 13 of semiconductor element 3 are connected by heating assembly 20 and melting joining member 4.

In this way, when terminal member 5 is joined to electrode 13 of semiconductor element 3 using assembly 20, terminal member 5 and joining member 4 can be handled as one component as assembly 20. As a result, it is possible to improve workability in the manufacturing process of semiconductor device 10.

In the method for manufacturing the semiconductor device, in terminal member 5, second through hole 55 may be provided in conductor portion 50 at a position away from first annular projecting portion 53. In assembly 20, second through hole 55 of conductor portion 50 may be disposed at a position facing joining member 4.

In this case, since second through hole 55 is a simple through hole and is not provided with first annular projecting portion 53, it is possible to suppress occurrence of a problem that the number of caulking portion 54 is too large to apply a necessary pressure to first annular projecting portion 53 when terminal member 5 is pressed against and joined to joining member 4 for joining.

A method for manufacturing a semiconductor device according to the present disclosure includes preparing, arranging, and connecting semiconductor element 3 having electrode 13. In the step of arranging, assembly 20 is disposed on electrode 13. Assembly 20 includes terminal member 5 and joining member 4. Terminal member 5 is terminal member 5 joined to electrode 13 of semiconductor element 3, and includes conductor portion 50 and first annular projecting portion 53. Conductor portion 50 has first main surface 50a. First annular projecting portion 53 is provided on first main surface 50a of conductor portion 50. First annular projecting portions 53 have an annular shape in planar view. Conductor portion 50 is provided with second through hole 55 at a position away from first annular projecting portion 53. Joining member 4 is connected to first main surface 50a of terminal member 5. First annular projecting portion 53 of terminal member 5 bites into joining member 4. In the step of arranging, assembly 20 is disposed such that joining member 4 of assembly 20 is in contact with electrode 13. In the step of connecting, terminal member 5 and electrode 13 of semiconductor element 3 are connected by heating assembly 20 and melting joining member 4. In this way, the semiconductor device according to the present embodiment can be obtained.

The embodiments disclosed herein should be considered to be illustrative in all respects and not restrictive. At least two of the embodiments disclosed herein may be combined as long as there is no contradiction. The scope of the present disclosure is defined by the claims, instead of the descriptions stated above, and it is intended that meanings equivalent to the claims and all modifications within the scope are included.

REFERENCE SIGNS LIST

2: dedicated jig, 3: semiconductor element, 4: joining member, 5: terminal member, 5a, 5b, 5c: layer, 6: support base, 6a: surface, 7: pressing member, 8: rod-shaped member, 9: rod-shaped die, 10: semiconductor device, 11: heat spreader, 12: solder block, 13, 311, 321: electrode, 20: assembly, 31, 32: element, 33: substrate, 34: frame, 50: conductor portion, 50a: first main surface, 50b: second main surface, 51: projecting portion, 51a, 57e, 57g, 57i: recess, 52: first through hole, 53: first annular projecting portion, 53a: outer peripheral side surface, 53b: inner peripheral side surface, 54: caulking portion, 55: second through hole, 57a: first protrusion, 57b: first recess, 57c: protruding portion, 57d: second recess, 57f, 62: protrusion, 57h: second protrusion, 61: through hole, 341: holding portion, 531: second annular projecting portion, W1: outer peripheral width, W2: inner peripheral width

The invention claimed is:

1. A terminal member to be joined to an electrode of a semiconductor element, the terminal member comprising:
a conductor portion having a first main surface and a second main surface located on a side opposite to the first main surface;
a first annular projecting portion provided on the first main surface of the conductor portion and having an annular shape in planar view; and
a recess provided on the second main surface and disposed at a position overlapping with the first annular projecting portion, wherein
the first annular projecting portion has an outer peripheral side surface,
the outer peripheral side surface is inclined with respect to the first main surface such that an outer peripheral width of the first annular projecting portion increases as a distance of the outer peripheral side surface from the first main surface increases, and
a columnar projecting portion on the first main surface, the columnar projecting portion being provided at a position away from the first annular projecting portion, the columnar projecting portion does not have any cavity and the columnar projecting portion is filled with the conductor portion.

2. A terminal member to be joined to an electrode of a semiconductor element, the terminal member comprising:
a conductor portion having a first main surface and a second main surface located on a side opposite to the first main surface;

a first annular projecting portion provided on the first main surface of the conductor portion and having an annular shape in planar view; and a recess provided on the second main surface and disposed at a position overlapping with the first annular projecting portion, wherein the first annular projecting portion has an inner peripheral side surface, the inner peripheral side surface is inclined with respect to the first main surface such that an inner peripheral width of the first annular projecting portion decreases as a distance of the inner peripheral side surface from the first main surface increases, and a columnar projecting portion on the first main surface, the columnar projecting portion being provided at a position away from the first annular projecting portion, the columnar projecting portion does not have any cavity and the columnar projecting portion is filled with the conductor portion.

3. The terminal member according to claim 1, wherein the columnar projecting portion has one of a circular shape or a polygonal shape in planar view.

4. The terminal member according to claim 1, wherein a width of the columnar projecting portion is either constant regardless of a position in a direction perpendicular to the first main surface, or increased as a distance of the position from the first main surface increases.

5. A terminal member to be joined to an electrode of a semiconductor element, the terminal member comprising:
 a conductor portion having a first main surface and a second main surface located on a side opposite to the first main surface;
 a first annular projecting portion provided on the first main surface of the conductor portion and having an annular shape in planar view;
 a recess provided on the second main surface and disposed at a position overlapping with the first annular projecting portion; and
 a columnar projecting portion on the first main surface, the columnar projecting portion being provided at a position on the first main surface, which is away from the first annular projecting portion, and wherein the columnar projecting portions projects away from the first main surface, and wherein the columnar projecting portion does not have any cavity and the columnar projecting portion is filled with the conductor portion.

6. The terminal member according to claim 5, wherein the first annular projecting portion has an outer peripheral side surface, and the outer peripheral side surface is inclined with respect to the first main surface such that an outer peripheral width of the first annular projecting portion increases as a distance of the outer peripheral side surface from the first main surface increases.

7. The terminal member according to claim 5, wherein the first annular projecting portion has an inner peripheral side surface, and the inner peripheral side surface is inclined with respect to the first main surface such that an inner peripheral width of the first annular projecting portion decreases as a distance of the inner peripheral side surface from the first main surface increases.

8. The terminal member according to claim 1, wherein the conductor portion is provided with a first through hole on an inner peripheral side of the first annular projecting portion.

9. The terminal member according to claim 1, further comprising:
 a second annular projecting portion provided at a position on the second main surface overlapping with the first annular projecting portion when viewed from a direction perpendicular to the second main surface, the second annular projecting portion having an annular shape in planar view.

10. The terminal member according to claim 1, wherein the conductor portion has a multilayer structure including a plurality of layers laminated in a direction intersecting the first main surface, and one of the plurality of layers includes an invar.

11. An assembly comprising:
 the terminal member according to claim 1; and
 a joining member connected to the first main surface of the terminal member, wherein
 the first annular projecting portion of the terminal member projects into the joining member.

12. A semiconductor device comprising:
 the assembly according to claim 11; and
 a semiconductor element including an electrode, wherein
 the joining member of the assembly is connected to the electrode.

13. A method for manufacturing an assembly, the method comprising:
 a step of arranging a joining member on a surface of a support base; and
 a step of arranging the terminal member according to claim 1 on the joining member, wherein
 in the step of arranging the terminal member, the terminal member is arranged such that the first main surface of the terminal member faces the joining member,
 a protrusion is provided on the surface of the support base at a position overlapping with the first annular projecting portion of the terminal member in a state where the terminal member is disposed on the joining member in the step of arranging the terminal member, and
 the method further comprising: a step of pressing the terminal member relatively against the joining member, wherein
 in the step of pressing, the first annular projecting portion of the terminal member projects into the joining member.

14. A method for manufacturing an assembly, the method comprising:
 a step of arranging a joining member on a surface of a support base; and
 a step of arranging the terminal member according to claim 1 on the joining member, wherein
 in the step of arranging the terminal member, the terminal member is arranged such that the first main surface of the terminal member faces the joining member,
 a through hole is provided on the surface of the support base at a position overlapping with the first annular projecting portion of the terminal member in a state where the terminal member is disposed on the joining member in the step of arranging the terminal member,
 the support base includes a rod-shaped member movably inserted into the through hole, and
 the method further comprising: a step of pressing the joining member toward a side of the terminal member by the rod-shaped member, and pressing the terminal member relatively against the joining member, wherein
 in the step of pressing, the first annular projecting portion of the terminal member projects into the joining member.

15. A method for manufacturing an assembly, the method comprising:
- a step pf arranging a joining member on a surface of a support base; and
- a step of arranging the terminal member according to claim 9 on the joining member, wherein
- in the step of arranging the terminal member, the terminal member is arranged such that the first main surface of the terminal member faces the joining member, and
- the method further comprising: a step of pressing the terminal member relatively against the joining member, wherein
- in the step of pressing, the first annular projecting portion of the terminal member projects into the joining member; and,
- after the step of pressing, a step of pressing the second annular projecting portion of the terminal member toward the joining member.

16. A method for manufacturing a semiconductor device, the method comprising:
- a step of preparing a semiconductor element including an electrode; and
- a step of arranging an assembly on the electrode, wherein the assembly includes:
- the terminal member according to claim 1; and
- a joining member connected to the first main surface of the terminal member,
- the first annular projecting portion of the terminal member projects into the joining member,
- in the step of arranging, the assembly is arranged such that the joining member of the assembly is in contact with the electrode, and
- the method further comprising: a step of connecting the terminal member and the electrode of the semiconductor element by heating the assembly and melting the joining member.

17. The method for manufacturing a semiconductor device according to claim 16, wherein
- in the terminal member, the conductor portion is provided with a second through hole at a position away from the first annular projecting portion, and
- in the assembly, the second through hole of the conductor portion is arranged at a position facing the joining member.

18. The terminal member according to claim 1, wherein the columnar projecting portion projects from the first main surface to the opposite direction towards the second surface.

19. The terminal member according to claim 2, wherein the columnar projecting portion projects from the first main surface to the opposite direction towards the second surface.

20. The terminal member according to claim 5, wherein the columnar projecting portion projects from the first main surface to the opposite direction towards the second surface.

* * * * *